United States Patent
Chen et al.

(10) Patent No.: US 11,687,011 B2
(45) Date of Patent: Jun. 27, 2023

(54) RETICLE CARRIER AND ASSOCIATED METHODS

(71) Applicant: Taiwan Semiconductor Manufacturing Company, Ltd., Hsinchu (TW)

(72) Inventors: Yen-Hsun Chen, Taipei (TW); Yi-Zhen Chen, Hsinchu (TW); Jhan-Hong Yeh, Hsinchu (TW); Han-Lung Chang, Kaohsiung (TW); Tzung-Chi Fu, Miaoli (TW); Li-Jui Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/446,402

(22) Filed: Aug. 30, 2021

(65) Prior Publication Data

US 2023/0062852 A1 Mar. 2, 2023

(51) Int. Cl.
| | |
|---|---|
| *G03F 7/20* | (2006.01) |
| *G03F 7/00* | (2006.01) |
| *H01L 21/687* | (2006.01) |
| *H01L 21/683* | (2006.01) |
| *H01L 21/673* | (2006.01) |

(52) U.S. Cl.
CPC .... *G03F 7/70741* (2013.01); *H01L 21/67359* (2013.01); *H01L 21/6831* (2013.01); *H01L 21/68742* (2013.01)

(58) Field of Classification Search
CPC .......... G03F 7/70741; H01L 21/67359; H01L 21/6831; H01L 21/68742
See application file for complete search history.

(56) References Cited

U.S. PATENT DOCUMENTS

| | | | |
|---|---|---|---|
| 2009/0038985 A1* | 2/2009 | Wang | G03F 7/70858 206/710 |
| 2021/0116821 A1* | 4/2021 | Chuang | H01L 21/67359 |
| 2022/0102177 A1* | 3/2022 | Chiu | G03F 7/7075 |

\* cited by examiner

*Primary Examiner* — Peter B Kim
(74) *Attorney, Agent, or Firm* — Harrity & Harrity, LLP

(57) ABSTRACT

A reticle carrier described herein is configured to quickly discharge the residual charge on a reticle so as to reduce, minimize, and/or prevent particles in the reticle carrier from being attracted to and/or transferred to the reticle. In particular, the reticle carrier may be configured to provide reduced capacitance between an inner baseplate of the reticle carrier and the reticle. The reduction in capacitance may reduce the resistance-capacitance (RC) time constant for discharging the residual charge on the reticle, which may increase the discharge speed for discharging the residual charge through support pins of the reticle carrier. The increase in discharge speed may reduce the likelihood that an electrostatic force in the reticle carrier may attract particles in the reticle carrier to the reticle. This may reduce pattern defects transferred to substrates that are patterned using the reticle, may increase semiconductor device manufacturing quality and yield, and may reduce scrap and rework of semiconductor devices and/or wafers.

20 Claims, 20 Drawing Sheets

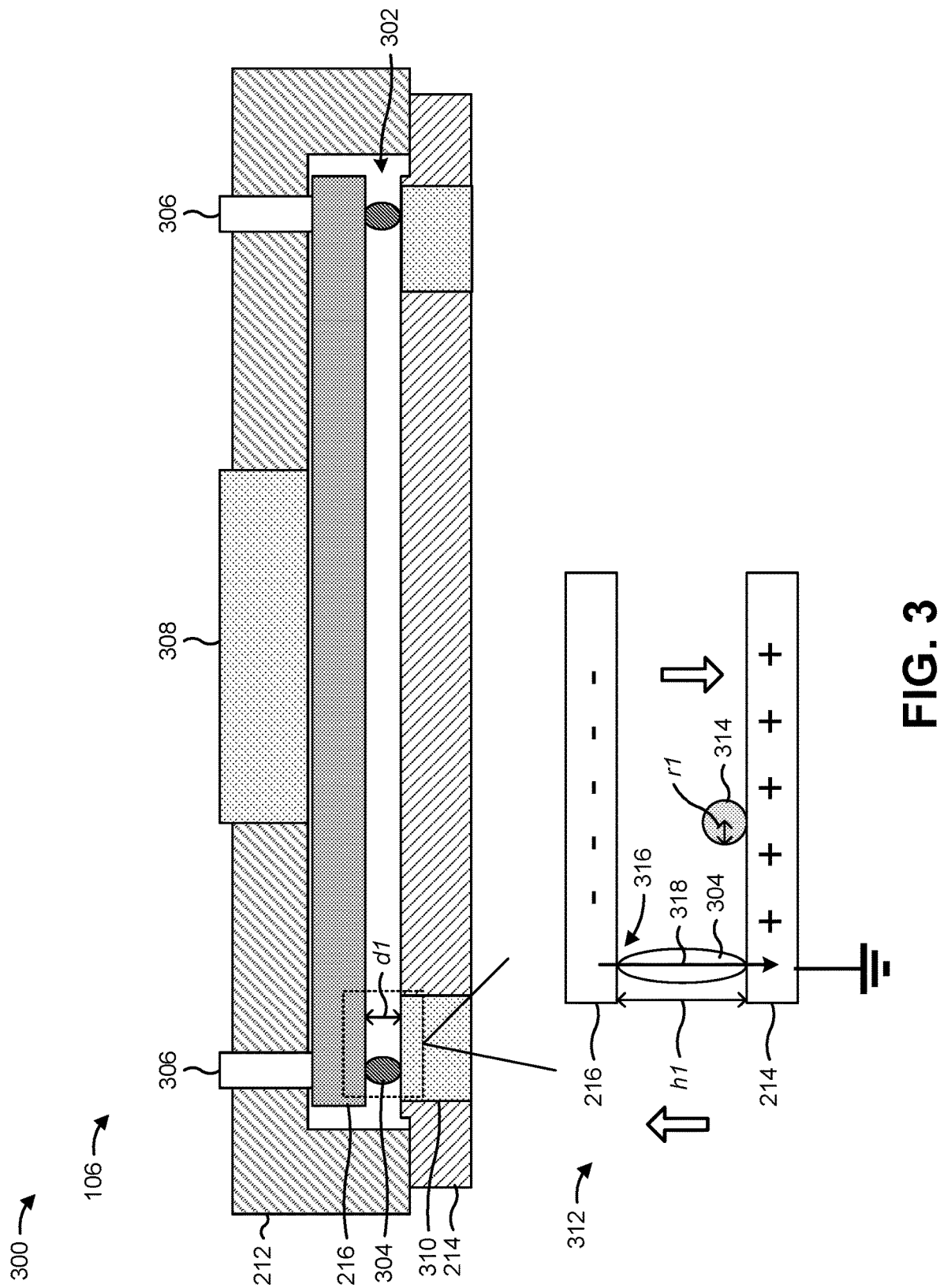

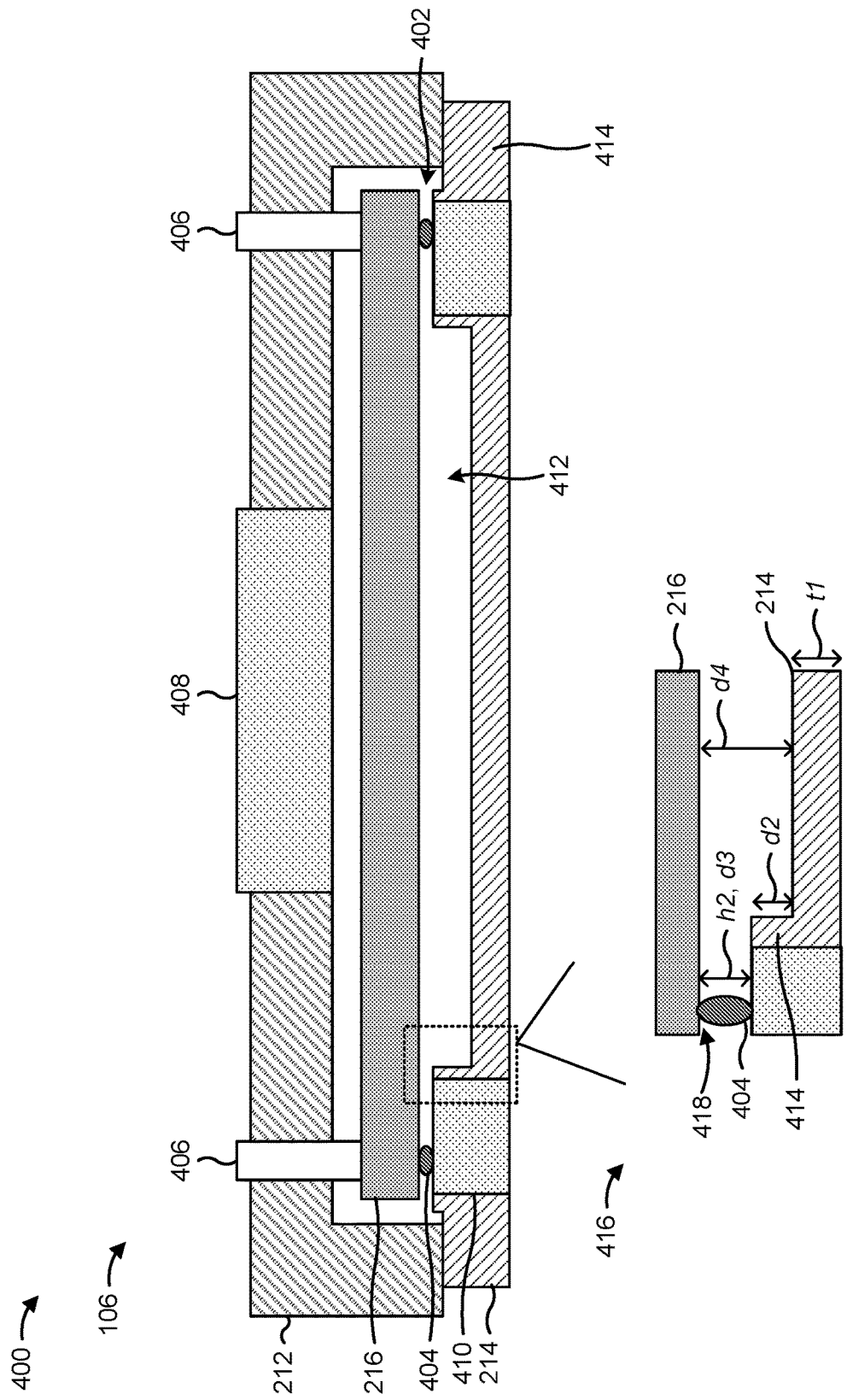

RETICLE CARRIER AND ASSOCIATED METHODS

BACKGROUND

A lithography mask, such as a photomask or a reticle, may be used in an exposure tool (e.g., a scanner or a stepper) to form a pattern on a substrate. The pattern may be developed such that the pattern can be used to form semiconductor structures and/or devices on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, and 4B are diagrams of example implementations of the reticle carrier of FIGS. 2A and 2B described herein.

DETAILED DESCRIPTION

Figure 1:
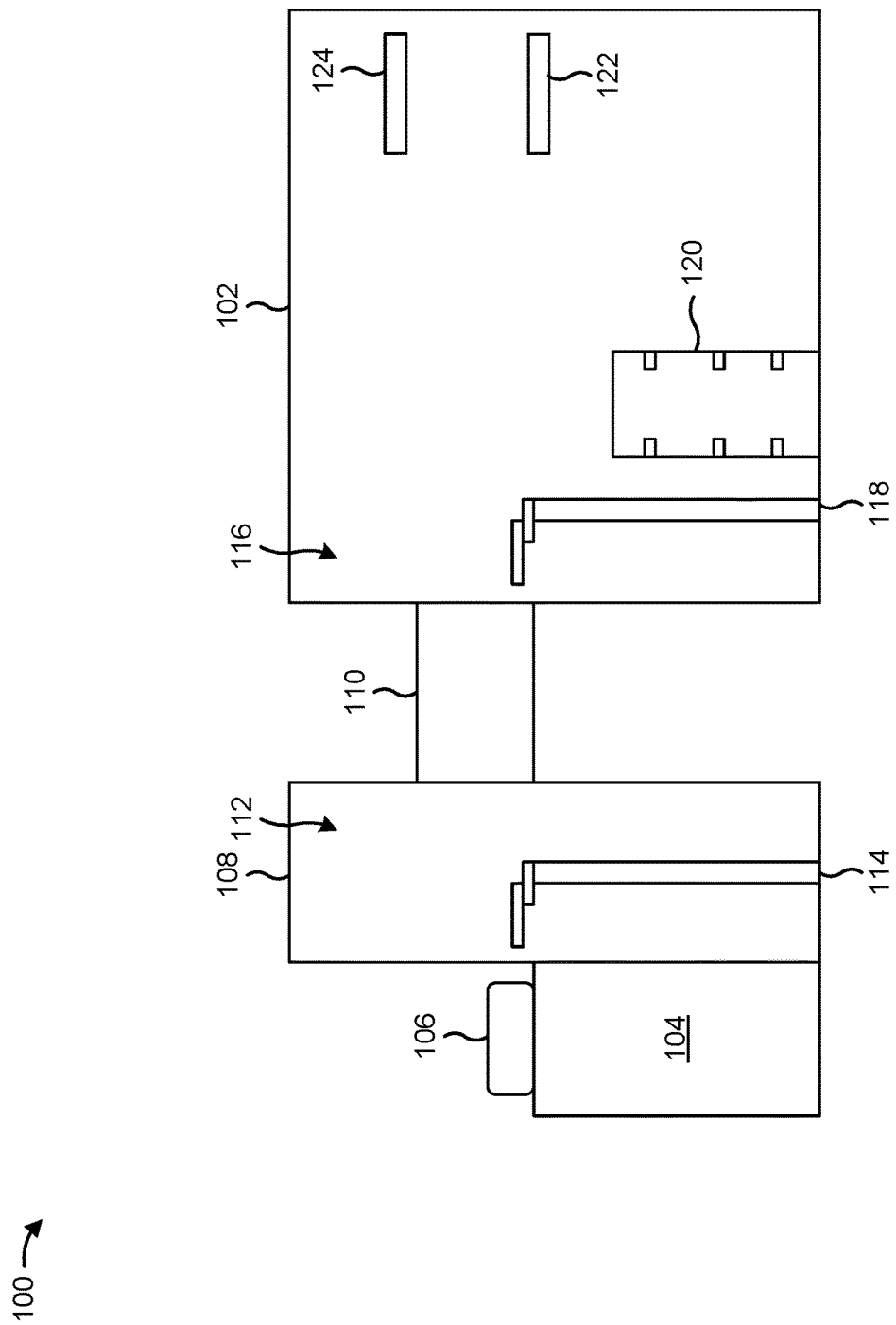
FIG. 1 is a diagram of an example semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A reticle (or another type of lithography mask) may be secured to a reticle stage of an exposure tool by an electrostatic clamp. After an exposure operation, the reticle may be removed from the reticle stage and placed in a reticle carrier. The reticle may be transported in the reticle carrier, which may be sealed to reduce and/or minimize ingress of humidity, oxygen, and/or particles (e.g., dust, debris, and/or other foreign objects) from damaging the reticle.

A reticle that is placed in a reticle carrier may have a residual charge that remains on the reticle after discharge of the electrostatic clamp. The residual charge may attract particles in the reticle carrier onto the reticle because of the difference in charge between the lithography mask and the mask stage. The particles may affect the pattern that is transferred from the reticle to a substrate. This can have significant impacts on semiconductor device manufacturing quality and yield, as any pattern defects may be repeatedly transferred to hundreds or thousands of substrates, which can lead to waste and additional semiconductor device manufacturing to replace the defective semiconductor devices.

Some implementations described herein provide reticle carriers, methods of use, and methods of formation. In some implementations, a reticle carrier described herein is configured to quickly discharge the residual charge on a reticle so as to reduce, minimize, and/or prevent particles in the reticle carrier from being attracted to and/or transferred to the reticle. In particular, the reticle carrier may be configured to provide reduced capacitance between an inner baseplate of the reticle carrier and the reticle. The reduction in capacitance may reduce the resistance-capacitance (RC) time constant for discharging the residual charge on the reticle, which may increase the discharge speed for discharging the residual charge through support pins of the reticle carrier. The increase in discharge speed may reduce the likelihood that an electrostatic force in the reticle carrier may attract particles in the reticle carrier to the reticle. This may reduce pattern defects transferred to substrates that are patterned using the reticle, may increase semiconductor device manufacturing quality and yield, and may reduce scrap and rework of semiconductor devices and/or wafers.

FIG. 1 is a diagram of an example semiconductor processing environment 100 described herein. The semiconductor processing environment 100 may include an environment in which substrates, such as semiconductor wafers, semiconductor devices, reticles, photomasks, and/or other components in a semiconductor fabrication facility, are processed through exposure operations to form pattern on the substrates for further processing in the semiconductor fabrication facility.

As shown in FIG. 1, the semiconductor processing environment 100 may include an exposure tool 102, a load port 104 on which a reticle carrier 106 may be positioned and/or supported, an interface tool 108, and a load lock chamber 110 connecting the exposure tool 102 and the interface tool 108.

The interface tool 108 may be configured to transfer reticles between the load port 104 and the exposure tool 102. The interface tool 108 may include an equipment front end module (EFEM) or similar type of interface tool that is situated between the load port 104 and the exposure tool 102. The interface tool 108 may include a chamber 112 that is sealed from the external environment of the semiconductor processing environment 100 to reduce and/or minimize contamination of reticles that are transferred through the interface tool 108.

The interface tool 108 may further include a reticle transport device 114 in the chamber 112. The reticle transport device 114 may include a robotic arm or another type of tool that is configured to transport reticles between the reticle carrier 106 and the exposure tool 102 through the load lock chamber 110. The load lock chamber 110 may include a chamber that is configured to permit the transfer of reticles between the interface tool 108 and the exposure tool 102 while maintaining environmental isolation between the interface tool 108 and the exposure tool 102.

The exposure tool 102 is a semiconductor processing tool that is capable of exposing a photoresist layer on a substrate to a radiation source, such as an ultraviolet light (UV) source (e.g., a deep UV light source, an extreme UV (EUV) light source, and/or the like), an x-ray source, an electron beam source, and/or another type of radiation source. The exposure tool 102 may expose a photoresist layer to the radiation source to transfer a pattern from a reticle (or a photomask) to the photoresist layer. The pattern may include one or more semiconductor device layer patterns for forming one or more semiconductor devices on the substrate, may include a pattern for forming one or more structures of a semiconductor device on the substrate, and/or may include a pattern for etching various portions of a semiconductor device and/or the substrate, among other examples. In some implementations, the exposure tool 102 includes a scanner, a stepper, an immersion lithography tool, an EUV lithography tool, or a similar type of exposure tool.

The exposure tool 102 may include a chamber 116 and a reticle transport device 118 in the chamber 116. A vacuum (or an ultra-high vacuum) may be maintained in the chamber 116 so that EUV exposure operations may be performed. The reticle transport device 118 may include a robotic arm or another type of tool that is configured to transport reticles between the exposure tool 102 and the load lock chamber 110. The exposure tool 102 may further include a cover rack 120 that is configured to support and/or secure an internal cover of the reticle carrier 106 while a reticle associated with the reticle carrier 106 is in use in the exposure tool 102. The reticle transport device 118 may position an internal cover of the reticle carrier 106 on one or more support members of the cover rack 120 to access the reticle associated with the reticle carrier 106.

The exposure tool 102 may include an exchanging station 122 configured to support and/or secure an inner baseplate of the reticle carrier 106 and the reticle associated with the reticle carrier 106. The exchanging station 122 may be further configured to move to various locations within the chamber 116 to position the reticle for securing to a reticle stage 124 of the exposure tool 102, to position the inner baseplate for retrieval of the reticle from the reticle stage 124, and/or to position the reticle and the inner baseplate for retrieval by the reticle transport device 118.

The reticle stage 124 may include an electrostatic chuck that is configured to secure the reticle in place for an exposure operation by an electrostatic clamp. The reticle stage 124 may form the electrostatic clamp by generating an electric potential (or an electrostatic field) between the reticle stage 124 and the reticle. The electric potential secures the reticle to the reticle stage 124. The reticle stage 124 may release the electrostatic clamp so that the reticle may be returned to the reticle carrier 106, and so that another reticle may be placed on the reticle stage 124 for another exposure operation.

In some implementations, the exposure tool 102 includes additional components to those shown in FIG. 1. For example, the exposure tool 102 may include an immersion lithography tool that operates in a deep UV spectrum, and may include a system of transmissive lenses that is configured to collimate, focus, collect, filter and/or direct UV radiation from a radiation source through a reticle or photomask and toward a substrate. As another example, the exposure tool 102 may include an EUV lithography tool that operates in an EUV spectrum, and may include a system of reflective mirrors that is configured to collimate, focus, collect, filter and/or direct UV radiation from a radiation source off of a reticle or photomask and toward a substrate.

As indicated above, FIG. 1 is provided as an example. Other examples may differ from what is described with regard to FIG. 1.

Figure 2A:
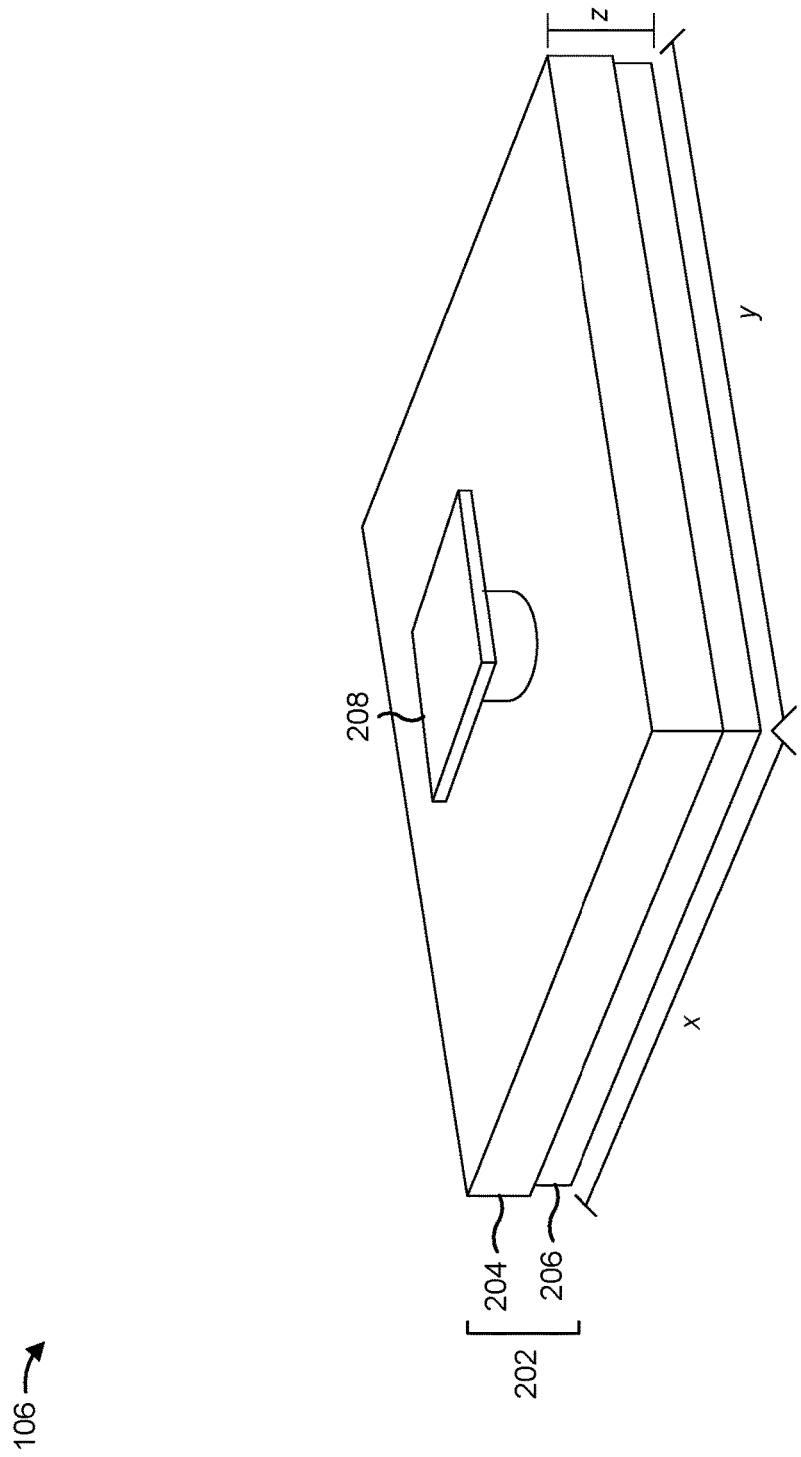
FIGS. 2A and 2B are diagrams of an example reticle carrier described herein for use in the semiconductor processing environment of FIG. 1.
Figure 2B:
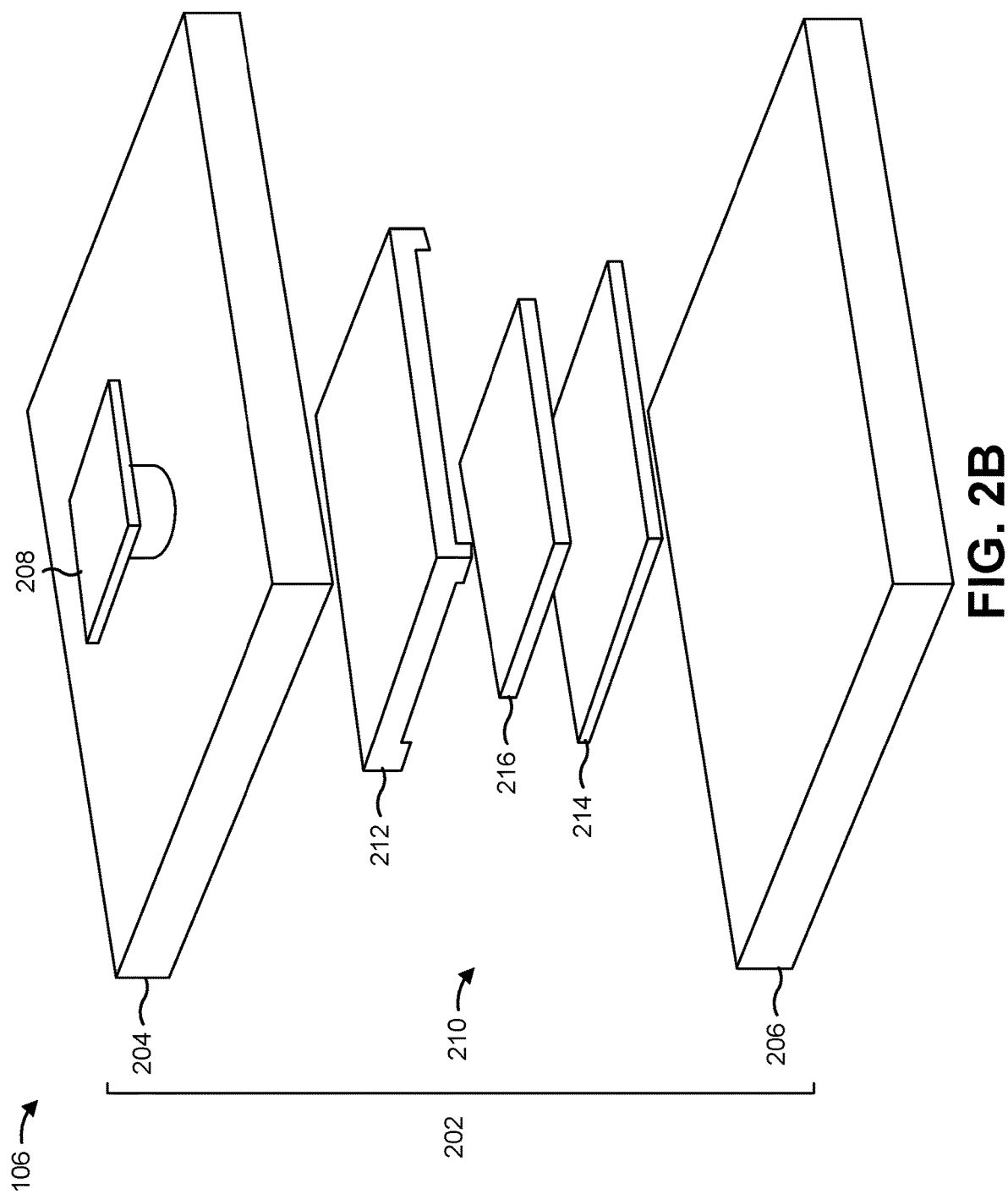

FIGS. 2A and 2B are diagrams of an example reticle carrier 106 described herein for use in the example semiconductor processing environment 100 of FIG. 1. In some cases, a residual charge may remain on a reticle from the electrostatic clamp that is used to secure the reticle to the reticle stage 124 (e.g., after the electrostatic clamp is released). Accordingly, the reticle carrier 106 may be configured to quickly discharge the residual charge on a reticle that is positioned in the reticle carrier 106 so as to reduce, minimize, and/or prevent particles in the reticle carrier from being attracted to and/or transferred to the reticle.

As shown in FIG. 2A, the reticle carrier 106 may include a housing 202 that includes an upper shell 204 and a lower shell 206. FIG. 2A illustrates an assembled configuration of the housing 202, in which the upper shell 204 is mated or coupled with the lower shell 206. An overhead hoist transport (OHT) head 208 may be included on a top portion of the upper shell 204 to permit the reticle carrier 106 to be transported by an OHT vehicle, by an automated material handling system (AMHS), by a reticle stocker, and/or by another automated transport device. As an example, a lift of an OHT vehicle may latch onto the OHT head 208 to load the reticle carrier 106 into the OHT vehicle and to secure the reticle carrier 106 while the reticle carrier 106 is transported in the OHT vehicle. Moreover, the lift of the OHT vehicle may unlatch from the OHT head 208 to provide the reticle carrier 106 to a location such as a staging area of a reticle storage system or to a load port (e.g., the load port 104) associated with an exposure tool (e.g., the exposure tool 102).

In some implementations, one or more dimensions of the housing 202, the upper shell 204, the lower shell 206, and/or the OHT head 208 may be configured to conform to and/or satisfy one or more standardized reticle carrier dimensional parameters to permit the reticle carrier 106 to be transported by various types of reticle transport devices. The one or more standardized reticle carrier dimensional parameters may include one or more parameters of a reticle carrier specification, such as SEMI E100, SEMI E111, and/or SEMI E112. The one or more dimensions may include external dimensions of the reticle carrier 106, such as a length dimension (the x dimension in FIG. 2A) of the housing 202, a width dimension (they dimension in FIG. 2A) of the housing 202, and/or a height dimension (the z dimension in FIG. 2A) of the housing 202. The external dimensions may be based a particular size of reticle (or a range of sizes of reticles) that the reticle carrier 106 is to transport, such as 6 inch reticles, 150 millimeter reticles, or 230 millimeter reticles, among other examples. An example range for the length dimension (the x dimension in FIG. 2A) may include approximately 175 millimeters to approximately 300 millimeters. An example range for the width dimension (they dimension in FIG. 2A) may include approximately 150 millimeters to approximately 230 millimeters. An example range for the height dimension (the z dimension in FIG. 2A) may include approximately 26 millimeters to approximately 100 millimeters. However, other values or ranges for the x dimension, they dimension, and/or the z dimension are within the scope of the present disclosure.

FIG. 2B illustrates an exploded configuration of housing 202 in which the upper shell 204 and the lower shell 206 are separated to expose an inner space 210 of the reticle carrier 106. The upper shell 204 and the lower shell 206 may be configured to form and enclose the inner space 210 when the upper shell 204 and the lower shell 206 are coupled. As further shown in FIG. 2B, the reticle carrier 106 may include an inner cover 212 and an inner baseplate 214. The inner cover 212 and the inner baseplate 214 may be sized and/or otherwise configured to fit within the inner space 210 formed by the upper shell 204 and the lower shell 206. Moreover, the inner cover 212 and the inner baseplate 214 may be sized and/or otherwise configured to secure or hold a reticle 216, and to permit secure transport of the reticle 216 in the reticle carrier 106. The reticle 216 may include an EUV reticle, an immersion lithography photomask, or another type of device on which a lithography pattern is included. The lithography pattern may be transferred to a substrate through reflection of radiation off of the lithography pattern or by transmission of the radiation through the lithography pattern.

The upper shell 204, the lower shell 206, the OHT head 208, the inner cover 212, and/or the inner baseplate 214 may be formed of various types of materials, including non-conductive materials and/or conductive materials. In some implementations, the upper shell 204, the lower shell 206, the OHT head 208, the inner cover 212, and/or the inner baseplate 214 are formed of a plastic or a polymer material. In some implementations, one or more portions of the upper shell 204, the lower shell 206, the OHT head 208, the inner cover 212, and/or the inner baseplate 214 are formed of a conductive material that is electrically connected to an electrical grounding point to permit a residual charge on the reticle 216 to be discharged through one or more portions of the reticle carrier 106.

As indicated above, FIGS. 2A and 2B are provided an example. Other examples may differ from what is described with regard to FIGS. 2A and 2B.

FIG. 3 is a diagram of an example implementation 300 of the reticle carrier 106 of FIGS. 2A and 2B described herein. The example implementation 300 may include an example in which the reticle carrier 106 includes support pins, on which the reticle 216 is to be secured, are configured such that the distance between the inner baseplate 214 and the reticle 216 reduces the capacitance between an inner baseplate 214 and the reticle 216. The reduction in capacitance may reduce the RC time constant for discharging a residual charge on the reticle 216, which may increase the discharge speed for discharging the residual charge through the support pins of the reticle carrier 106. The increase in discharge speed may reduce the likelihood that an electrostatic force in the reticle carrier 106 attract particles in the reticle carrier 106 to the reticle 216 and/or may reduce the size of particles that are attracted to the reticle 216.

As shown in FIG. 3, the reticle 216 may be positioned within an inner space 302 formed by the inner cover 212 and the inner baseplate 214. The reticle carrier 106 may include a plurality of support pins 304 that are configured to maintain the reticle 216 off of the inner baseplate 214 in the inner space 302. The reticle carrier 106 may include additional support members 306 in and/or on the inner cover 212 to secure the reticle 216 in place and to prevent vibration and/or other types of movement of the reticle carrier 106 from causing the reticle 216 to contact the inner cover 212. The inner cover 212 may include a filter 308 that is configured to filter the air or gas, that is provided to the inner space 302, of particles and/or other types of contaminants. The inner baseplate 214 may include a plurality of alignment windows 310 that permit the reticle 216 to be properly aligned when securing the reticle to the reticle stage 124.

As shown in a close-up view 312 in FIG. 3, the reticle 216 may have a negative residual charge when placed in the reticle carrier 106. The inner baseplate 214 may be maintained at a positive charge. The difference in polarity between the reticle 216 and the inner baseplate 214 may cause an electric field to be generated between the reticle 216 and the inner baseplate 214. The electric field may apply a force to particles 314 on the inner baseplate 214. The force may attract the particles 314 toward and onto the reticle 216. The stronger the electric field is, the stronger the force that is applied to the particles 314. Accordingly, the stronger the electric field, the larger the size of particles 314 that may be attracted to the reticle 216.

To reduce the effect of the electric field, the inner baseplate 214 may be connected to an electrical ground such that the residual charge on the reticle 216 may be discharged through the support pins 304. However, a capacitive effect between the negatively charged reticle 216 and the positively charged inner baseplate 214 may slow or reduce the speed of discharge of the residual charge from the reticle 216. The capacitive effect promotes the storage of charge between the reticle 216 and the inner baseplate 214, which resists the discharge of the residual charge from the reticle 216. This increases the RC time constant for discharging the residual charge, which increases the time duration to fully discharge the residual charge.

Accordingly, the support pins 304 may be configured to facilitate discharging of a residual charge on the reticle 216 when the reticle 216 is placed in the reticle carrier 106. In particular, the support pins 304 may be sized such that a distance (d1) between the reticle 216 and the inner baseplate 214 (e.g., the surface of the inner baseplate 214 facing or orientated toward the reticle 216) reduces and/or minimizes the capacitance between the reticle 216 and the inner baseplate 214. In this way, the distance (d1) may be configured to reduce, minimize, and/or prevent the attraction of particles 314 toward the reticle 216 that might otherwise be caused by the residual charge on the reticle 216.

In the example implementation 300, the distance (d1) may correspond to the height (h1) of the support pins 304 from the inner baseplate 214 to the top 316 of the support pins 304. Thus, the greater the height (h1) of the support pins 304 (and thus, the greater the distance (d1)) the lower the capacitance between the reticle 216 and the inner baseplate 214 for the same area reticle 216, the same area inner baseplate 214, and the same permittivity between the reticle 216 and the inner baseplate 214. The lower the capacitance between the reticle 216 and the inner baseplate 214, the quicker the discharge speed of the residual charge on the reticle 216 through a discharge path 318 through the support pins 304. The quicker the discharge speed, the smaller the size (e.g., the smaller the radius ($r_1$)) of particles 314 that are likely to be attracted toward the reticle 216. As an example, the height (h1) of the support pins 304 may be configured as approximately 200 microns to prevent particles 314 having a radius (r1) equal to or greater than approximately 147 nanometers from being attracted to the reticle 216. As another example, the height (h1) of the support pins 304 may be configured as approximately 400 microns to prevent particles 314 having a radius (r1) equal to or greater than approximately 75 nanometers from being attracted to the reticle 216. As another example, the height (h1) of the support pins 304 may be configured as approximately 1000 microns to prevent particles 314 having a radius (r1) equal to or greater than approximately 22 nanometers from being attracted to the reticle 216. In some implementations, the height (h1) of the support pins 304 (and thus, the greater the distance (d1)) may be in a range of approximately 1150 microns to approximately 4000 microns to provide a sufficient capacitance decrease while minimizing the increase to the overall weight of the reticle carrier 106 and impact to reticle transport devices 114 and 118. However, other values for the distance (d1) and the height (h1) are within the scope of the present disclosure.

In some implementations, the height (h1) of the support pins 304 (and thus, the greater the distance (d1)) may be determined and configured based on a model. The model may be used to determine or estimate the distance (d1) between the inner baseplate 214 and the reticle 216 (and thus, the height (h1) of the support pins 304) such that one or more parameter thresholds are satisfied. The one or more threshold parameters may include, for example, a threshold particle size, a capacitance threshold, an electrostatic force threshold, and/or another threshold parameter threshold.

In some implementations, a device (e.g., the device 600 described herein in connection with FIG. 6) may determine the threshold particle size to prevent particles 314 equal to or greater than the threshold particle size from being electrostatically attracted to the reticle 216. The device may use the model to determine the distance (d1) between the inner baseplate 214 and the reticle 216 (and thus, the height (h1) of the support pins 304) such that capacitance threshold for a capacitance between the inner baseplate 214 and the reticle 216 is satisfied. In this way, the device may determine the capacitance, using the model, such that the capacitance is low enough to quickly discharge the residual charge on the reticle 216 so as to prevent particles 314 equal to or greater than the threshold particle size from being electrostatically attracted to the reticle 216.

The model may include an electrostatic force threshold for attracting particles 314 equal to and/or greater than the threshold particle size to the reticle 216. The device may determine the electrostatic force threshold based on:

$$F_E = Q_{induced} E(t)$$

where $Q_{induced}$ corresponds to the magnitude of the residual charge on the reticle 216 and E (t) is the electric field magnitude of an estimated electric field (which may be time-varying during discharging of the residual charge) between the inner baseplate 214 and the reticle 216. The device may determine the electric field magnitude based on:

$$E(t) = \frac{V(t)}{d}$$

where V(t) corresponds to an electric potential (which may be time-varying during discharging of the residual charge) between the inner baseplate 214 and the reticle 216 and d corresponds to the distance (d1) and the height (h1). The device may determine the electric potential based on:

$$V(t) = \frac{Q(t)}{C}$$

where Q (t) corresponds to the time-varying residual charge (which may be referred to as a discharge rate parameter) on the reticle 216 and C corresponds to the capacitance between the inner baseplate 214 and the reticle 216. The device may determine the time-varying residual charge based on:

$$Q(t) = Q_0 \frac{-t}{e^{R_{Support}C}}$$

where $Q_0$ corresponds to the initial magnitude of the residual charge prior to discharging, $R_{Support}$ corresponds to the resistance of the support pins 304, and C corresponds to the capacitance between the inner baseplate 214 and the reticle 216. The resistance of the support pins 304 ($R_{Support}$) and the distance (d1) and the height (h1) correspond to the RC time constant between the inner baseplate 214 and the reticle 216.

Based on the relationships defined above, the device may determine the exponential decay of the residual charge based on the resistance of the support pins 304 ($R_{Support}$) and the distance (d1) and the height (h1) to satisfy a particular discharge rate parameter associated with the reticle 216. In particular, the device may determine the distance (d1) and the height (h1) to increase or decrease the RC time constant, and thus the rate of exponential decay of the residual charge, to correspondingly increase or decrease the time-varying electric potential and the time-varying electric field magnitude to satisfy the electrostatic force threshold. Accordingly, the greater the distance (d1) and the height (h1) determined by the device, the lesser the electrostatic force that is to be applied to particles 314 in the reticle carrier 106, which reduces the size of particles 314 that are attracted to the reticle 216.

As indicated above, FIG. 3 is provided an example. Other examples may differ from what is described with regard to FIG. 3.

Figure 4B:
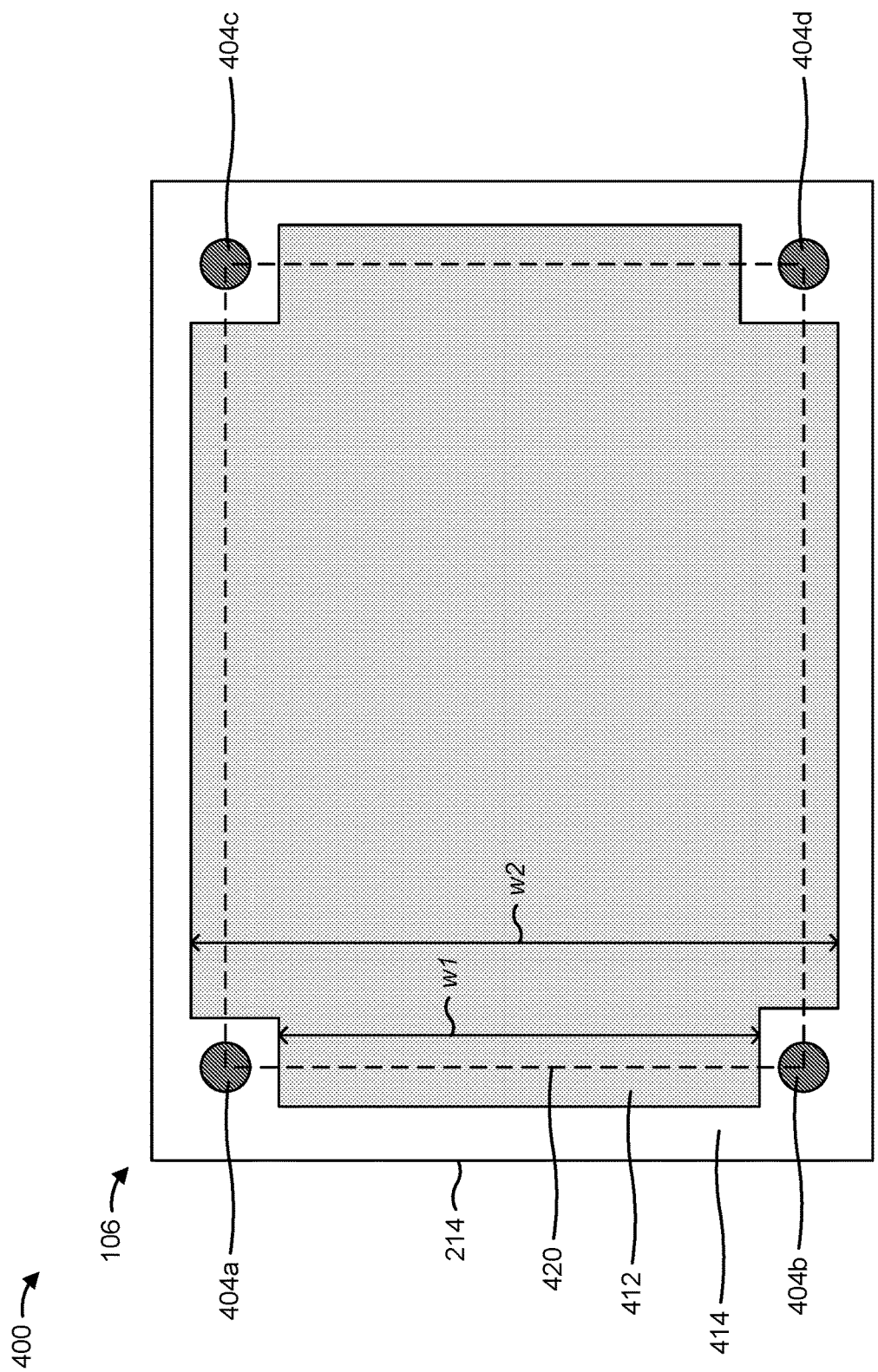

FIGS. 4A and 4B are diagrams of an example implementation 400 of the reticle carrier 106 of FIGS. 2A and 2B described herein. The example implementation 400 may include an example in which the reticle carrier 106 includes a recessed region in a portion of the inner baseplate 214. The recessed region results in the distance between the reticle 216 and the inner baseplate 214 being greater in the portion of the inner baseplate 214 that includes the recessed region. The increased distance provided by the recessed region reduces the capacitance between an inner baseplate 214 and the reticle 216. The reduction in capacitance may reduce the RC time constant for discharging a residual charge on the reticle 216, which may increase the discharge speed for discharging the residual charge through the support pins of the reticle carrier 106. The increase in discharge speed may reduce the likelihood that an electrostatic force in the reticle carrier 106 attract particles 314 in the reticle carrier 106 to the reticle 216 and/or may reduce the size of particles 314 that are attracted to the reticle 216.

As shown in the cross-sectional view in FIG. 4A, the reticle carrier 106 may include elements 402-410 in the example implementation 400, which may be similar to elements 302-310 in the example implementation 300. However, the inner baseplate 214 of the reticle carrier 106 may include a recessed region 412. The recessed region 412 may be located in a portion of the inner baseplate 214 over which the reticle 216 is configured to be positioned. The distance between the inner baseplate 214 in the recessed region 412 and the reticle 216 may be greater relative to a distance between the inner baseplate 214 in a non-recessed portion 414 and the reticle 216 to decrease the capacitance between the inner baseplate 214 and the reticle 216 (and thus, to increase the discharge rate of the residual charge on the reticle 216).

As shown in a close-up portion 416 in FIG. 4A, the recessed region 412 may be included in the inner baseplate 214 and may have a depth (d2) relative to a top surface of the non-recessed portion 414. The depth (d2) of the recessed region may be in a range of approximately 1000 microns to approximately 3500 microns to provide a sufficient discharge rate of the residual charge on the reticle 216 and to minimize the increase to the overall weight of the reticle carrier 106 and impact to reticle transport devices 114 and 118. However, other values for the depth (d2) are within the scope of the present disclosure. The thickness (d) of the inner baseplate 214 in the recessed region 412 may be in a range of approximately 5000 microns to approximately 7500 microns to provide sufficient strength and structural rigidity for the inner baseplate 214. However, other values for the thickness (t1) are within the scope of the present disclosure. The ratio between the depth (d2) and the thickness (t1) of the baseplate in the recessed region may be in a range of approximately 0.13 to approximately 0.7 to provide a sufficiently deep recessed region 412 and to maintain sufficient structural rigidity for the inner baseplate 214. However, other values for the ratio are within the scope of the present disclosure.

As indicated above in connection with FIG. 3, a device (e.g., the device 600 described in connection with FIG. 6) may use the model to determine the distance between the inner baseplate 214 and the reticle 216 to satisfy one or more parameter thresholds. Similarly, the device may use the model described above to determine the depth (d2) of the recessed region 412 and/or a height (h2) of the support pins 404 (which may correspond to a distance (d3) between the inner baseplate 214 in the non-recessed portion 414 and a top 418 of the support pins 404) such that an overall distance (d4) between the inner baseplate 214 and the reticle 216 in the recessed region 412 satisfies one or more parameter thresholds. As an example, the device may determine to increase the height (h2) of the support pins 404 and/or increase the depth (d2) of the recessed region 412 to increase the overall distance (d4), which may increase the discharge rate of discharging the residual charge on the reticle 216. In some implementations, the overall distance (d4) is in a range of approximately 1150 microns to approximately 4000 microns to provide a sufficient capacitance decrease while minimizing the increase to the overall weight of the reticle carrier 106 and the impact to reticle transport devices 114 and 118. However, other values for the overall distance (d4) are within the scope of the present disclosure. In this way, the device may use the model to satisfy a capacitance threshold for a capacitance between the inner baseplate 214 and the reticle 216 based on a threshold particle size to satisfy a discharge rate parameter associated with the reticle 216, and/or to satisfy another parameter or parameter threshold.

As shown in a top-down view in FIG. 4B, the recessed region 412 may be included within a perimeter 420 defined by support pins 404a, 404b, 404c, and 404d. Moreover, the recessed region 412 may extend between two support pins, such as between support pins 404a and 404b, between support pins 404a and 404c, between support pins 404b and 404d, and between support pins 404c and 404d. A width (w1) of the recessed region 412, that is in between two support pins (e.g., the support pins 404a and 404b) may be in a range of approximately 130 millimeters to approximately 140 millimeters so that the recessed region 412 fits in between the support pins and provides sufficiently low capacitance between the inner baseplate 214 and the reticle 216. However, other values for the width (w1) are within the scope of the present disclosure. A width (w2) of the recessed region 412, that is not in between two support pins (e.g., the support pins 404a and 404b) may be in a range of 140 millimeters to approximately 155 millimeters so that the recessed region 412 fully extends to the outside edges of the support pins and provides sufficiently low capacitance between the inner baseplate 214 and the reticle 216. However, other values for the width (w2) are within the scope of the present disclosure.

As indicated above, FIGS. 4A and 4B are provided an example. Other examples may differ from what is described with regard to FIGS. 4A and 4B.

FIGS. 5A-5K are diagrams of an example implementation 500 described herein. The example implementation 500 may include an example of transferring the reticle 216 from the reticle stage 124 to the reticle carrier 106.

Figure 5A:
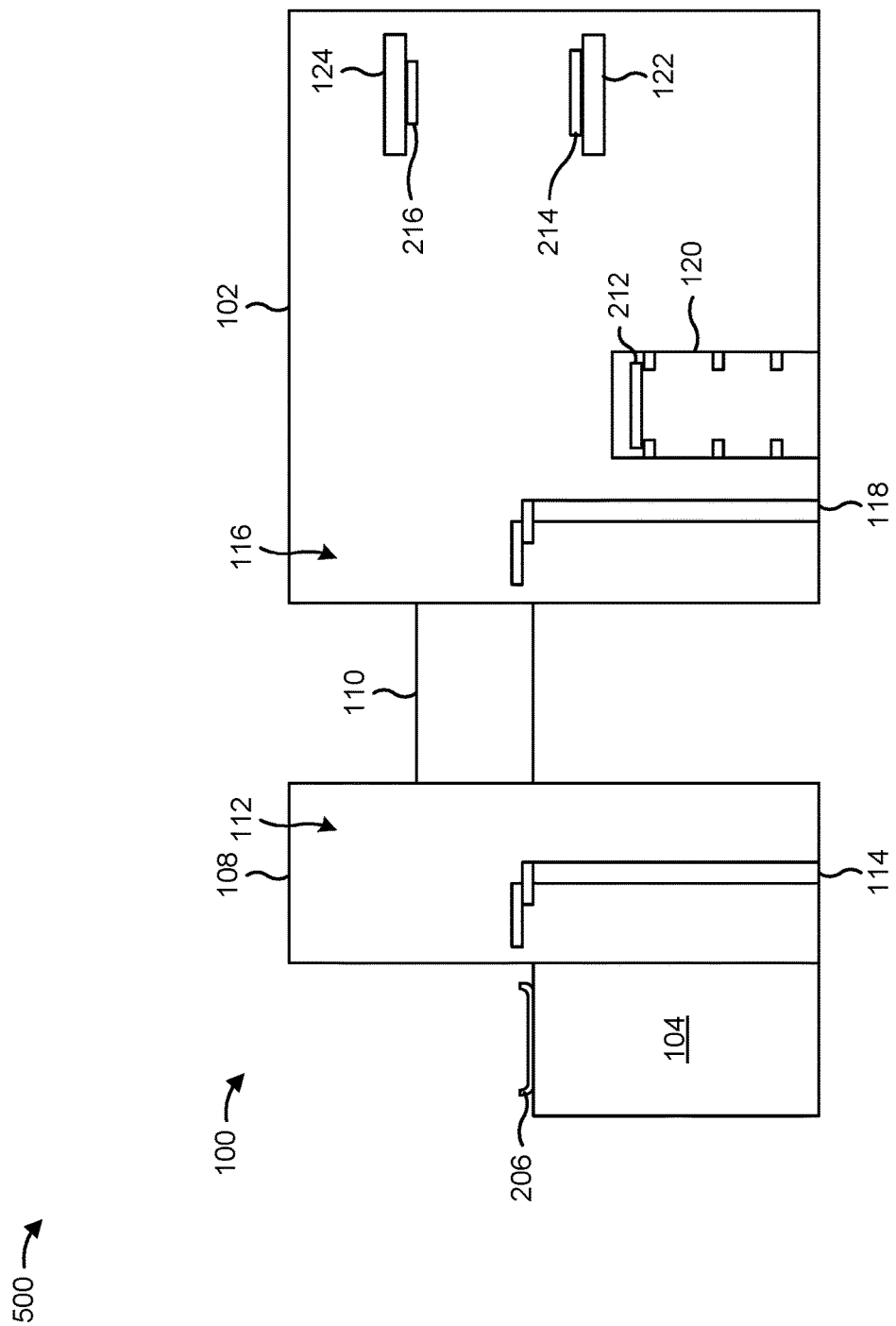
FIGS. 5A-5K are diagrams of an example implementation described herein.

As shown in FIG. 5A, the reticle 216 may be secured to the reticle stage 124, which may include an electrostatic chuck. The reticle 216 may be secured to the reticle stage 124 by an electrostatic clamp, where opposing charges on the reticle 216 and on the reticle stage 124 attract the reticle 216 toward the reticle stage 124. The exposure tool 102 may perform an exposure operation in which the reticle 216 is used to transfer a pattern of the reticle 216 to a substrate as part of formation of one or more semiconductor devices on the substrate. As further shown in FIG. 5A, the inner baseplate 214 of the reticle carrier 106 may be positioned on the exchanging station 122 in preparation for receiving the reticle 216. The inner cover 212 may be positioned in one of the slots of the cover rack 120.

Figure 5B:
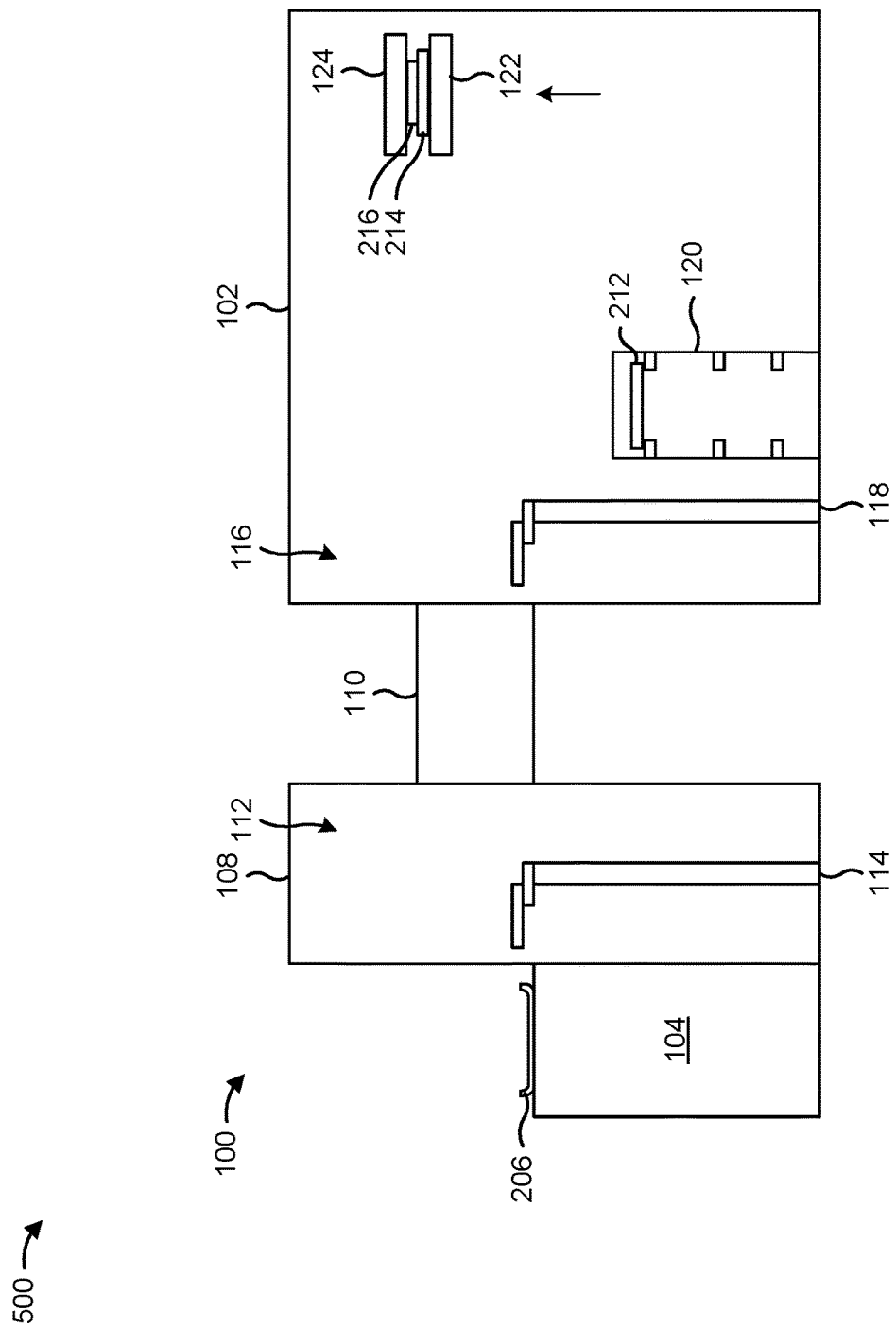

As shown in FIG. 5B, the exposure tool 102 may move the exchanging station 122 to position the inner baseplate 214 under the reticle 216. For example, the exposure tool 102 may move the exchanging station 122 to position the inner baseplate 214 under the reticle 216 after the exposure operation to exchange out the reticle 216 (e.g., for another reticle). With the inner baseplate 214 positioned under the reticle 216, the exposure tool 102 may release the electrostatic clamp between the reticle stage 124 and the reticle 216. This causes the reticle 216 to be no longer secured to the reticle stage 124 and, instead, supported on the inner baseplate 214. In particular, the reticle 216 may be supported on the plurality of support pins (e.g., the support pins 304 and/or 404) included on the inner baseplate 214.

As described above, a residual charge may remain on the reticle 216 after release of the electrostatic clamp. Accordingly, the residual charge may begin to be discharged through the plurality of support pins when the reticle 216 is positioned on the plurality of support pins. The distance (d1, d4) between the reticle 216 and the inner baseplate 214 may be configured, as described above in connection with FIG. 3 or FIGS. 4A and 4B, to reduce, minimize, and/or prevent the attraction of particles 314 of a particular size from the inner baseplate 214 of the reticle carrier 106 to the reticle 216. As an example, the distance (d1, d4) between the reticle 216 and the inner baseplate 214 may be configured, as described above in connection with FIG. 3 or FIGS. 4A and 4B, to reduce, minimize, and/or prevent the attraction of particles 314 equal to or greater than a threshold particle size.

Figure 5C:
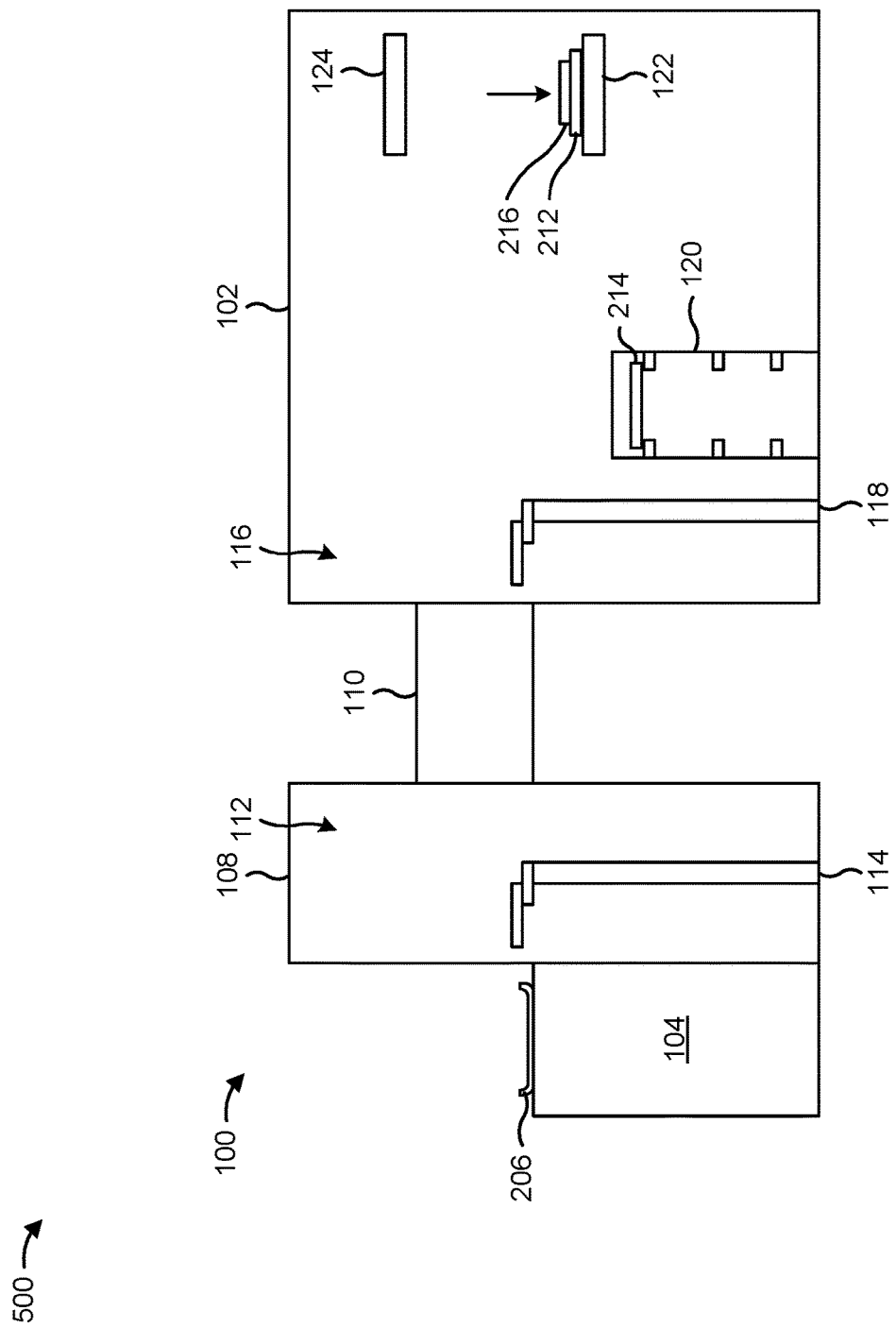
Figure 5D:
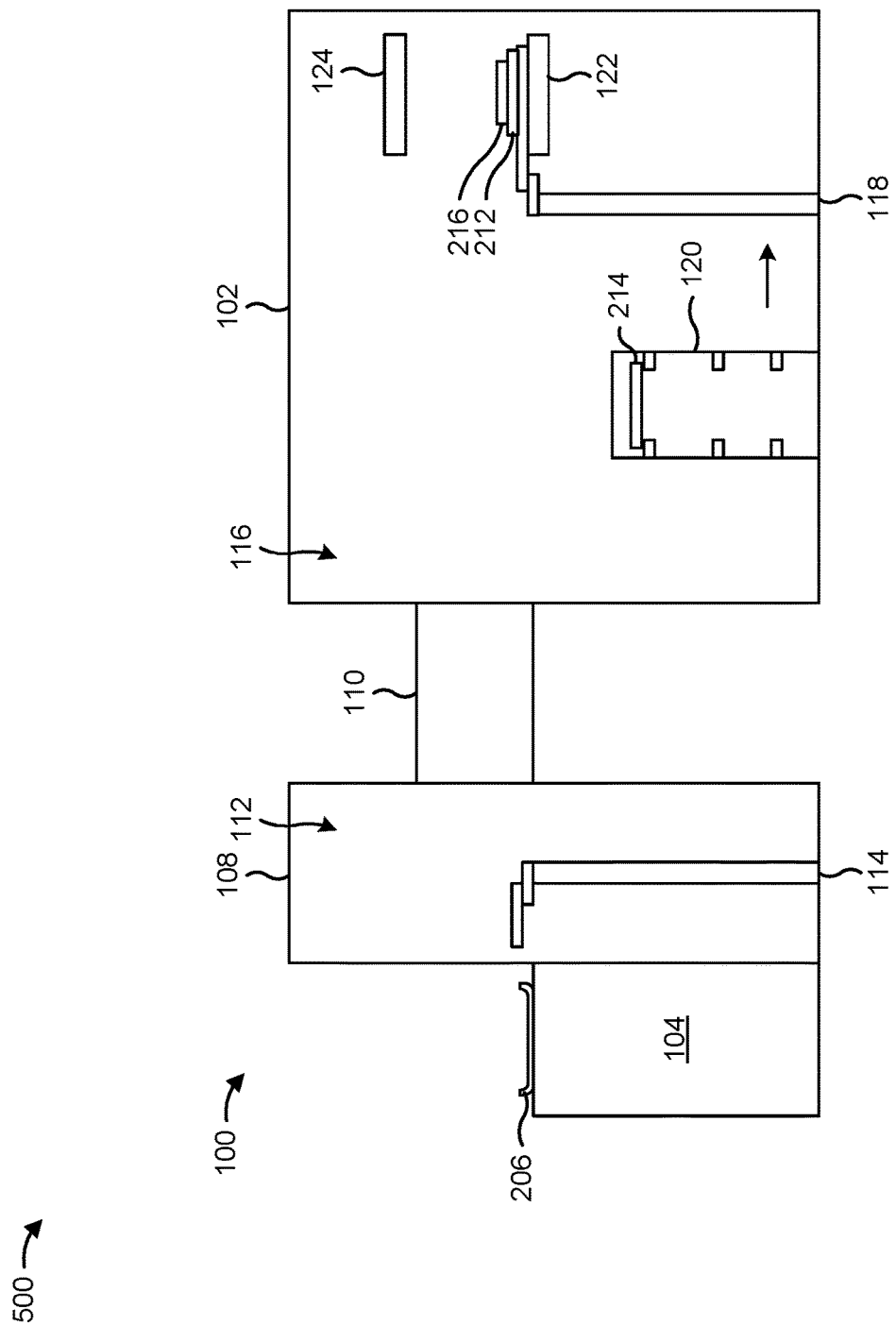

As shown in FIG. 5C, the exposure tool 102 may lower or otherwise move the exchanging station 122 toward the cover rack 120. As shown in FIG. 5D, the reticle transport device 118 may move toward the exchanging station 122 and may retrieve the reticle 216 on the inner baseplate 214 from the exchanging station 122.

Figure 5E:
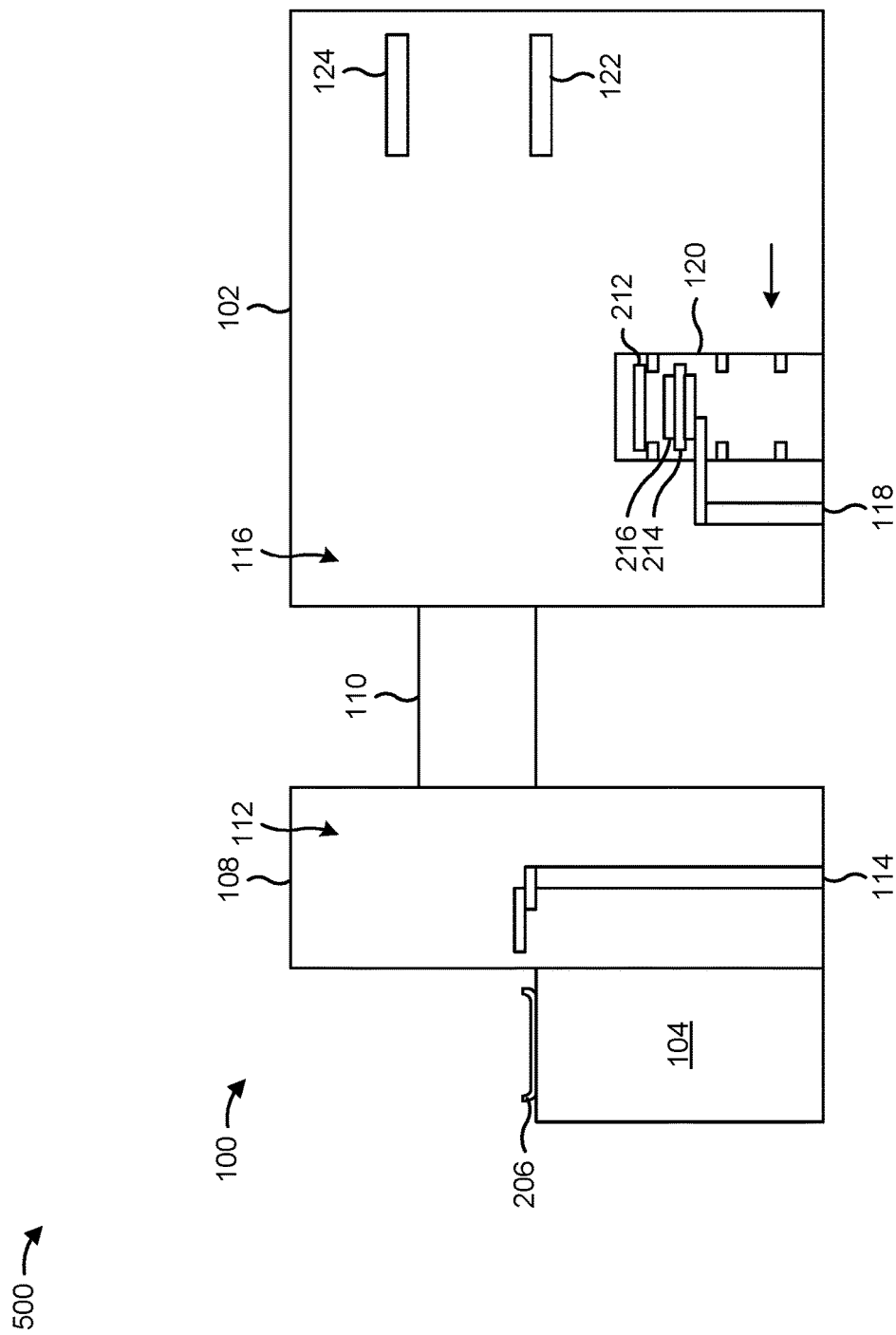

As shown in FIG. 5E, the reticle transport device 118 may position the inner baseplate 214, with the reticle 216 positioned on the inner baseplate 214, under the inner cover 212 in the cover rack 120. In some implementations, the reticle transport device 118 moves the reticle 216 and the inner baseplate 214 upward so that the inner cover 212 is positioned over and on the inner baseplate 214 such that the reticle 216 is enclosed in an inner space (e.g., the inner space 302 and/or 402) formed between the inner cover 212 and the inner baseplate 214. In some implementations, the inner cover 212 is lowered onto the inner baseplate 214 such that the reticle 216 is enclosed in the inner space formed between the inner cover 212 and the inner baseplate 214.

Figure 5F:
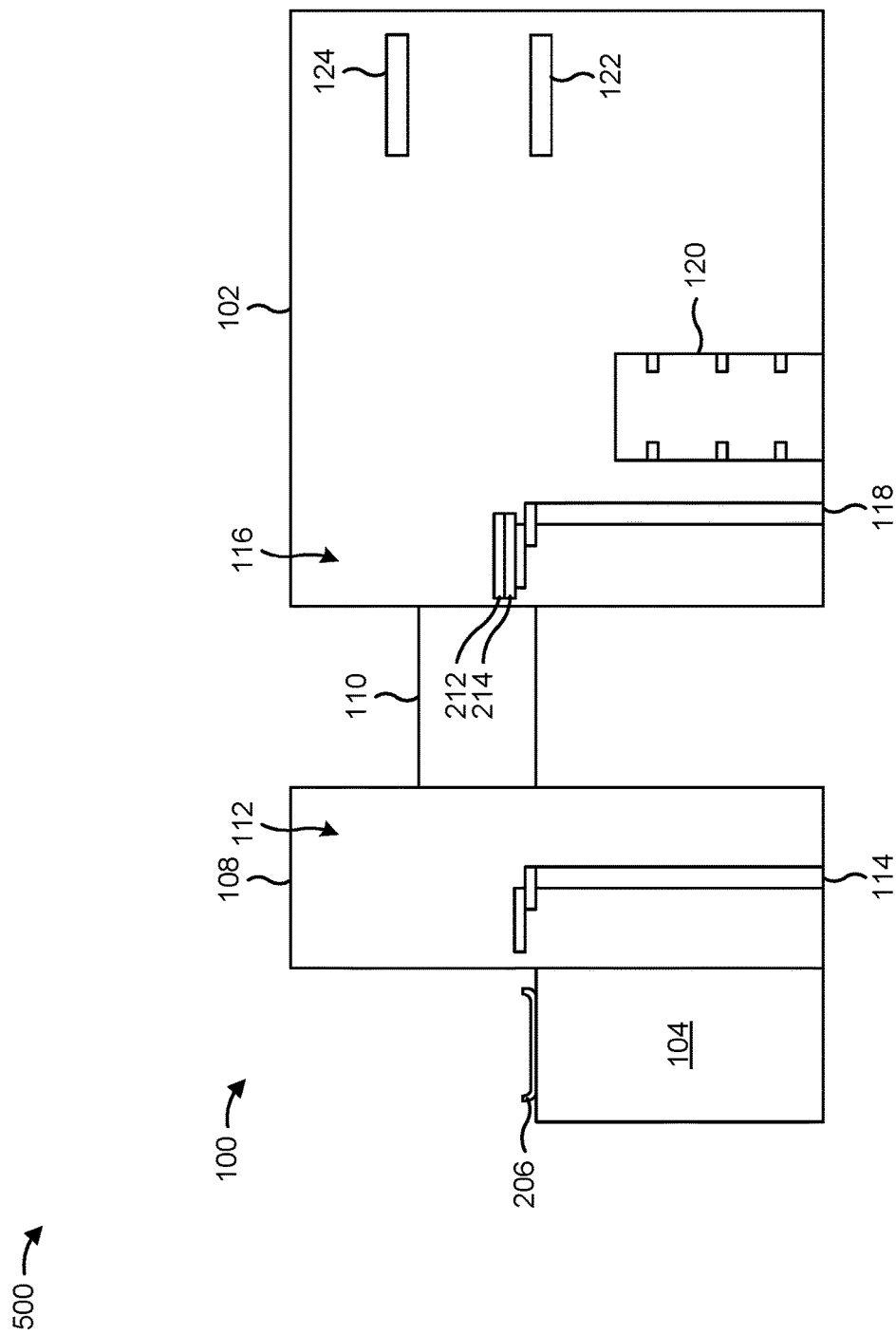
Figure 5G:
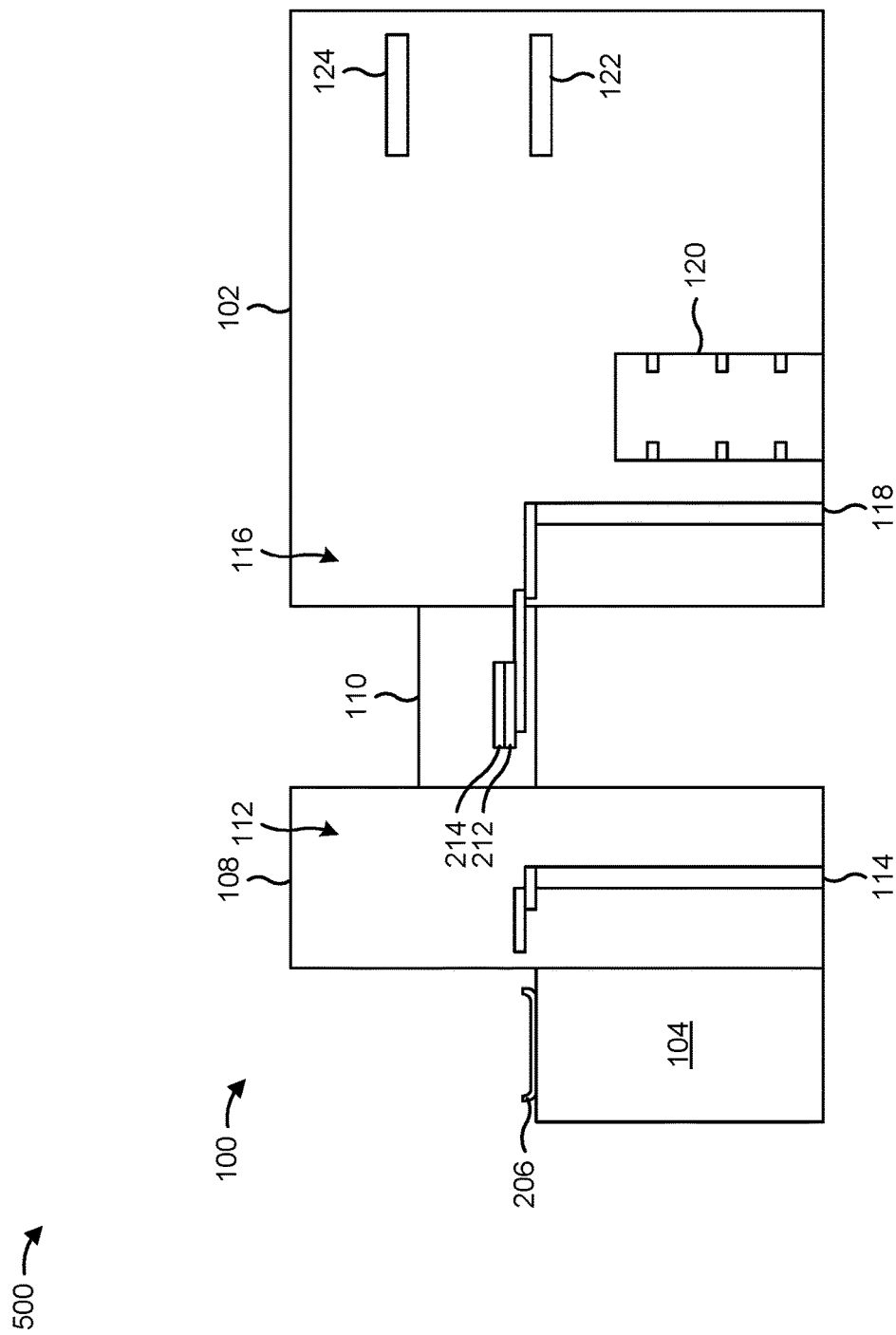

As shown in FIG. 5F, the reticle transport device 118 may position the inner cover 212 and the inner baseplate 214 (with the reticle 216 enclosed therein) in front of the load lock chamber 110. As shown in FIG. 5G, the reticle transport device 118 may extend such that the inner cover 212 and the inner baseplate 214 (with the reticle 216 enclosed therein) are positioned in the load lock chamber 110 in preparation for passing the inner cover 212 and the inner baseplate 214 (with the reticle 216 enclosed therein) to the reticle transport device 114.

Figure 5H:
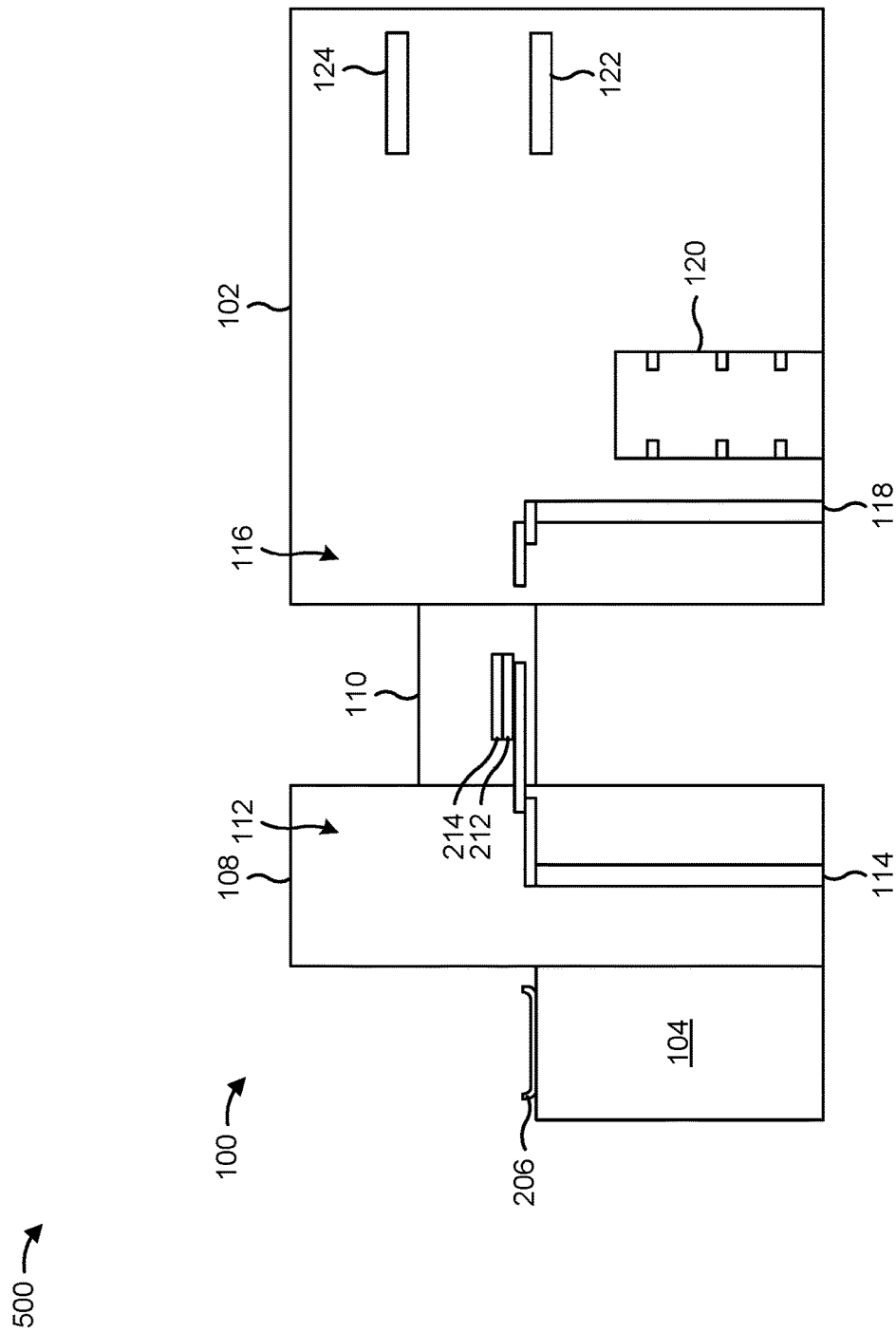
Figure 5I:
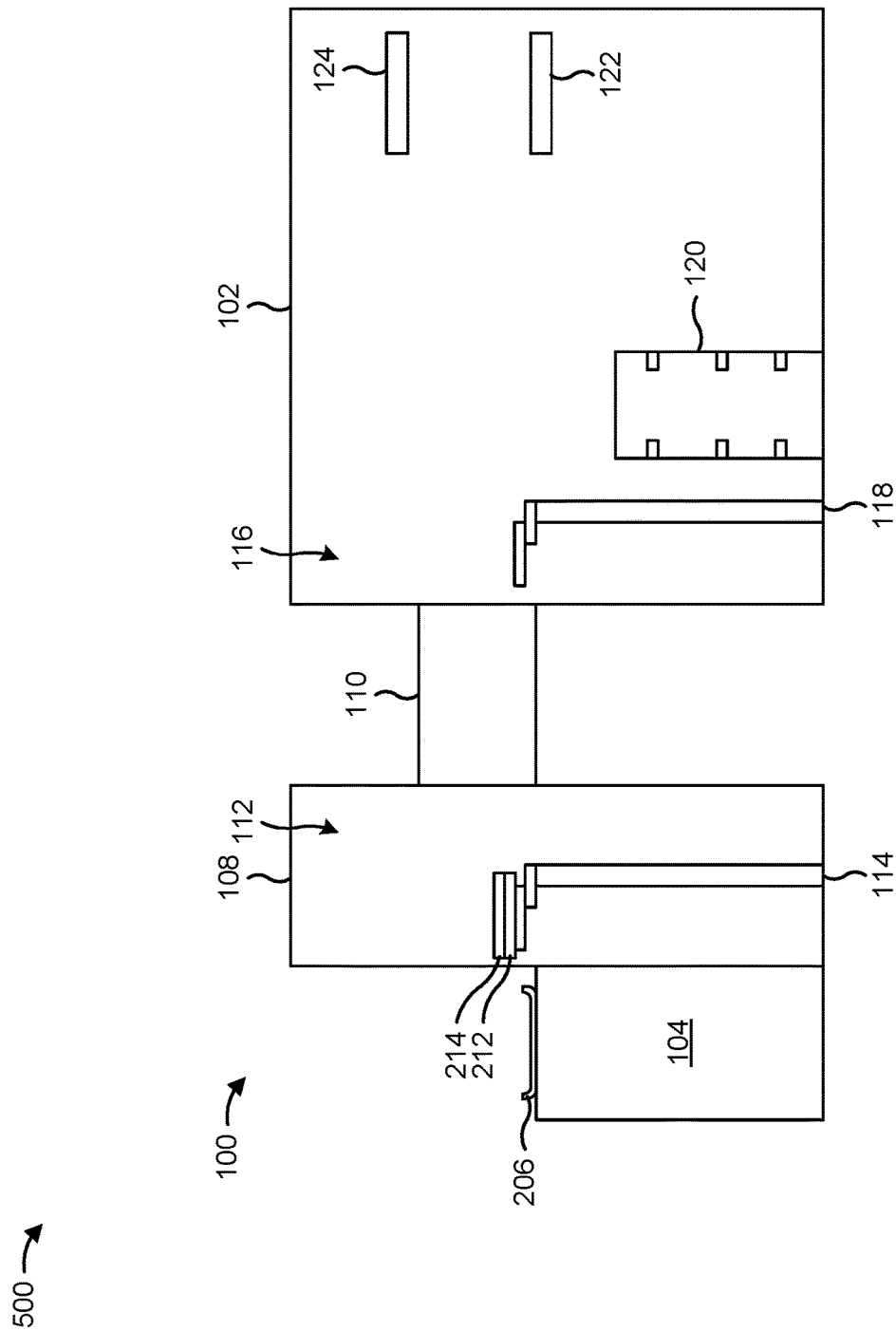

As shown in FIG. 5H, the reticle transport device 114 may retrieve the inner cover 212 and the inner baseplate 214 (with the reticle 216 enclosed therein) from the reticle transport device 118. As shown in FIG. 5I, the reticle transport device 114 may retract the inner cover 212 and the inner baseplate 214 (with the reticle 216 enclosed therein) from the load lock chamber 110 and into the chamber 112 of the interface tool 108.

Figure 5J:
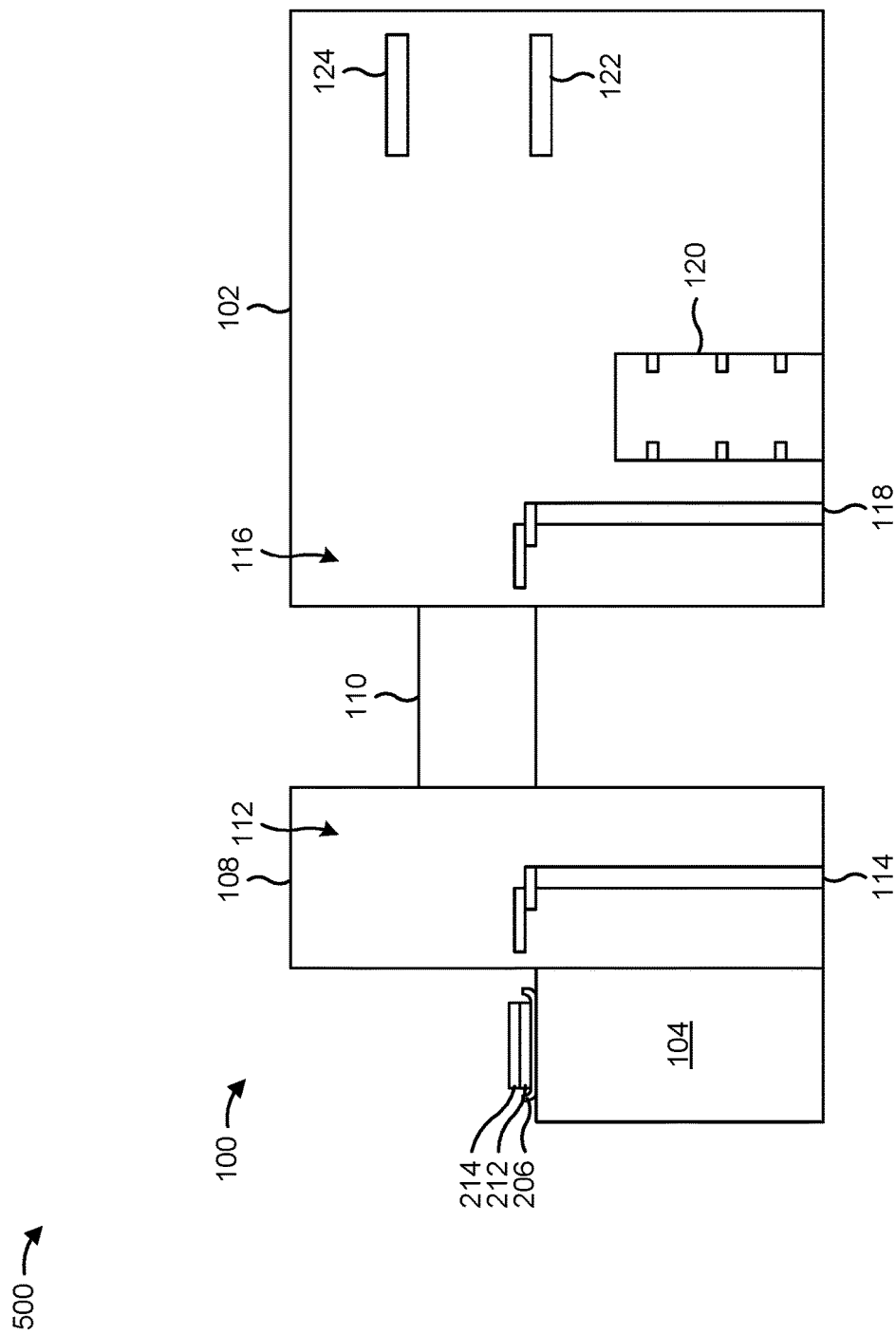
Figure 5K:
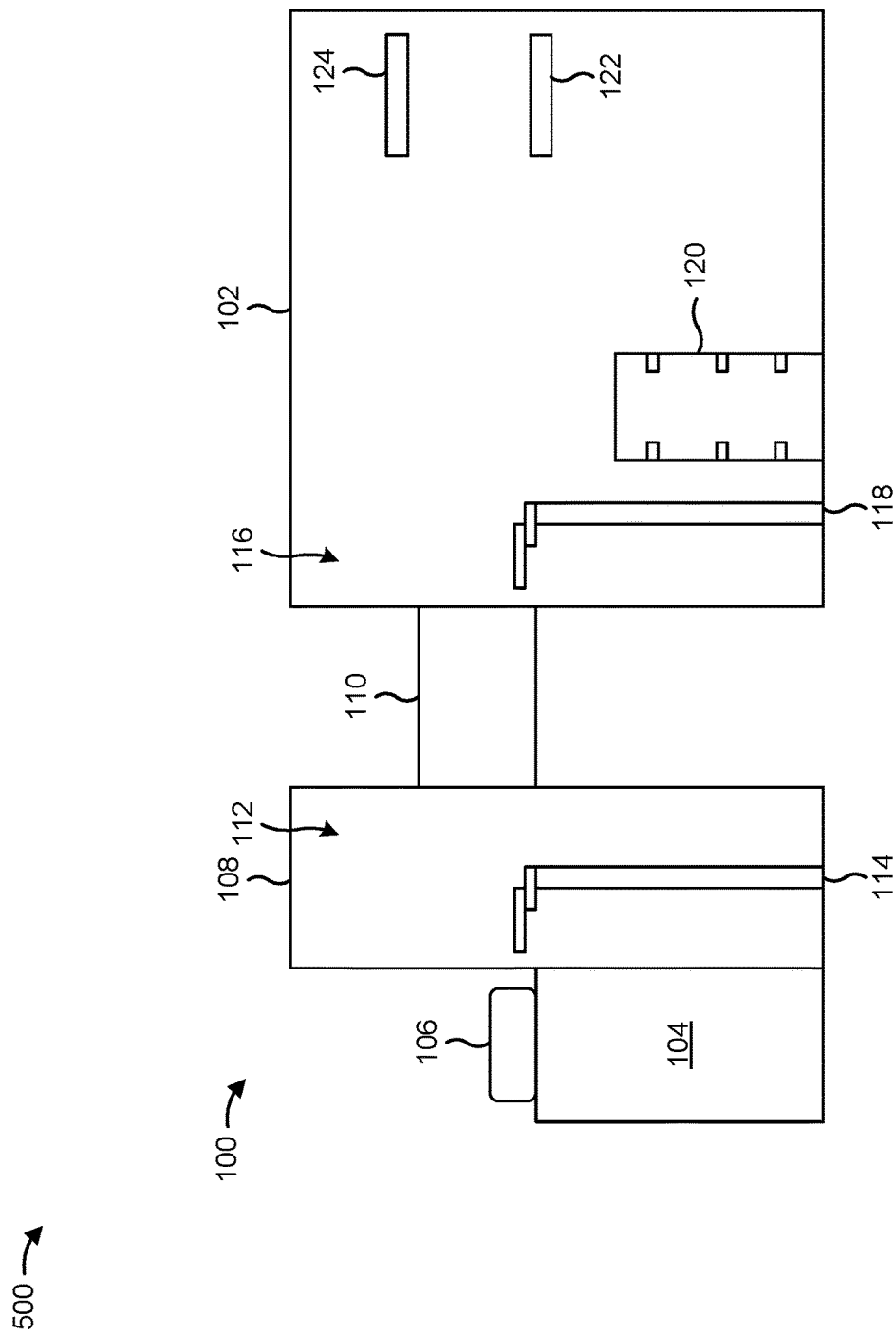

As shown in FIG. 5J, the reticle transport device 114 may extend the inner cover 212 and the inner baseplate 214 (with the reticle 216 enclosed therein) out of the chamber 112 and onto the lower shell 206 of the reticle carrier 106. The lower shell 206 may be positioned on the load port 104 in preparation for receiving the inner cover 212 and the inner baseplate 214 (with the reticle 216 enclosed therein). As shown in FIG. 5K, the upper shell 204 may be placed onto the lower shell 206 such that the inner cover 212 and the inner baseplate 214 (with the reticle 216 enclosed therein) are positioned in the inner space 210 formed by the upper shell 204 and the lower shell 206. Accordingly, an OHT vehicle or another type of transport device may retrieve the reticle carrier 106 from the load port 104 and may transport the reticle carrier 106 to another location such as a reticle storage system.

As indicated above, FIGS. 5A-5K are provided an example. Other examples may differ from what is described with regard to FIGS. 5A-5K.

Figure 6:
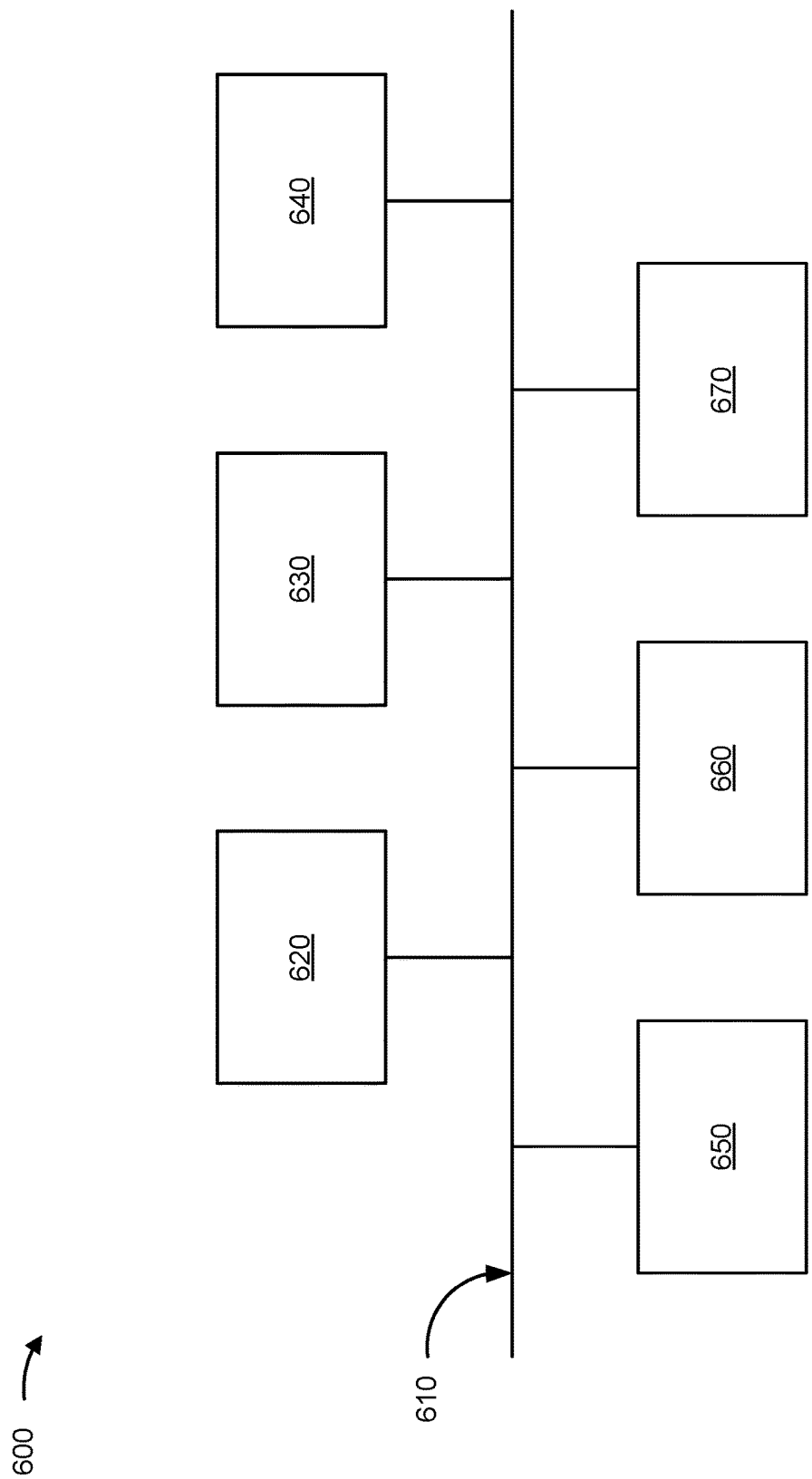
FIG. 6 is a diagram of example components of one or more devices of FIG. 1.

FIG. 6 is a diagram of example components of a device 600. In some implementations, the exposure tool 102, the load port 104, the interface tool 108, the reticle transport device 114, and/or the reticle transport device 118 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
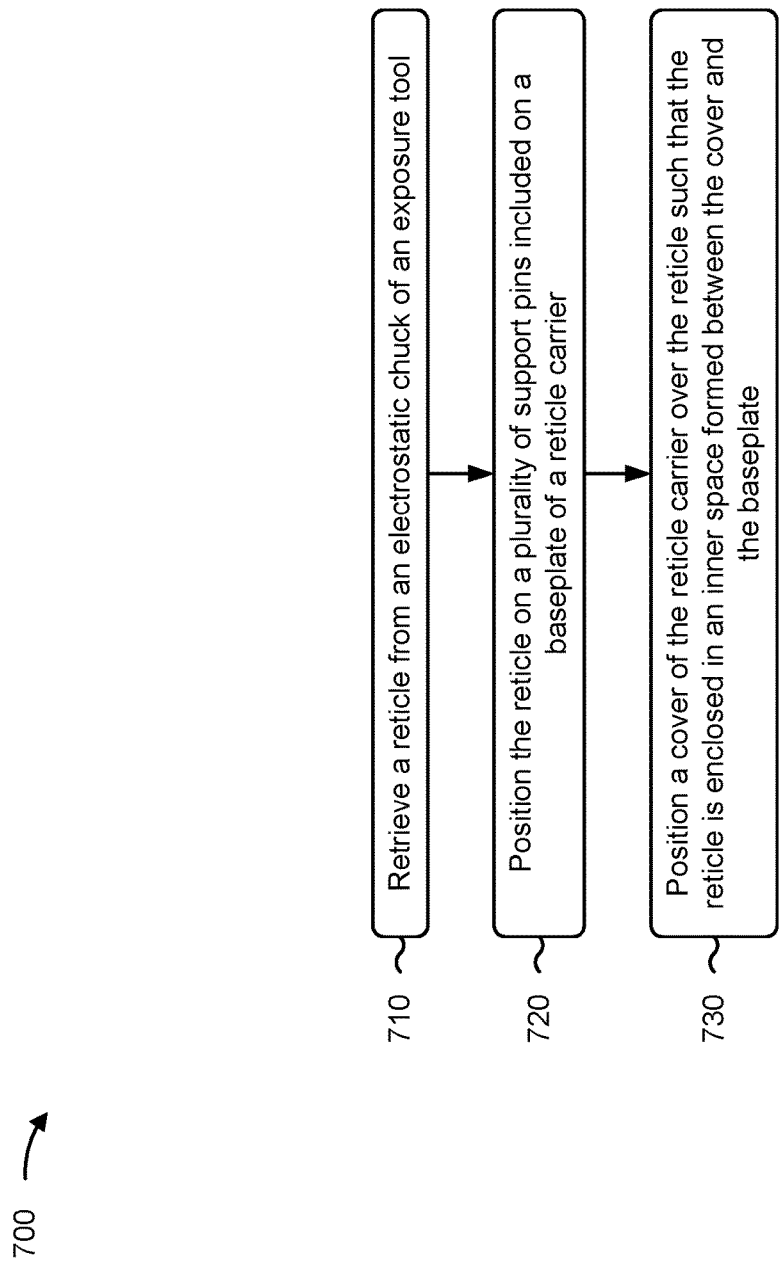
FIG. 7 is a flowchart of an example process relating to transferring a reticle to a reticle carrier described herein.

FIG. 7 is a flowchart of an example process 700 associated with transferring a reticle to a reticle carrier described herein. In some implementations, one or more process blocks of FIG. 7 may be performed by one or more devices and/or tools (e.g., one or more of the exposure tool 102, the load port 104, the interface tool 108, the reticle transport device 114, and/or the reticle transport device 118). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include retrieving a reticle from an electrostatic chuck of an exposure tool (block 710). For example, the exposure tool 102 may use the exchanging station 122 to retrieve the reticle 216 from an electrostatic chuck (e.g., the reticle stage 124) of the exposure tool 102, as described above.

As further shown in FIG. 7, process 700 may include positioning the reticle on a plurality of support pins included on a baseplate of a reticle carrier (block 720). For example, the exposure tool 102 may use the exchanging station 122 to position the reticle 216 on a plurality of support pins (e.g., the support pins 304 and/or 404) included on the inner baseplate 214 of the reticle carrier 106, as described above. In some implementations, a residual charge on the reticle 216 from the electrostatic chuck is discharged through the plurality of support pins when the reticle 216 is positioned on the plurality of support pins. In some implementations, a distance (d1, d4) between the reticle 216 and the inner baseplate 214 is configured to prevent attraction of particles 314 equal to or greater than a threshold particle size from the inner baseplate 214 to the reticle 216.

As further shown in FIG. 7, process 700 may include positioning a cover of the reticle carrier over the reticle such that the reticle is enclosed in an inner space formed between the cover and the baseplate (block 730). For example, the exposure tool 102 may use the reticle transport device 118 to position the inner cover 212 of the reticle carrier 106 over the reticle 216 such that the reticle 216 is enclosed in an inner space (e.g., the inner space 302 and/or 402) formed between the inner cover 212 and the inner baseplate 214, as described above.

Process 700 may include additional implementations, such as any single implementation or any combination of implementations described below and/or in connection with one or more other processes described elsewhere herein.

In a first implementation, the distance (d1) between the reticle 216 and the inner baseplate 214 corresponds to the height (h1) of the plurality of support pins 304. In a second implementation, alone or in combination with the first implementation, the distance (d4) between the reticle 216 and the inner baseplate 214 corresponds to a combination of the height (h2) of the plurality of support pins 404 and the depth (d2) of the recessed region 412 in the inner baseplate 214. In a third implementation, alone or in combination with one or more of the first and second implementations, the distance (d1, d4) between the reticle 216 and the inner baseplate 214 is configured to satisfy a discharge rate parameter associated with the reticle 216.

In a fourth implementation, alone or in combination with one or more of the first through third implementations, the distance (d1, d4) between the reticle 216 and the inner baseplate 214 is configured to satisfy a capacitance parameter associated with the reticle 216 and the inner baseplate 214.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
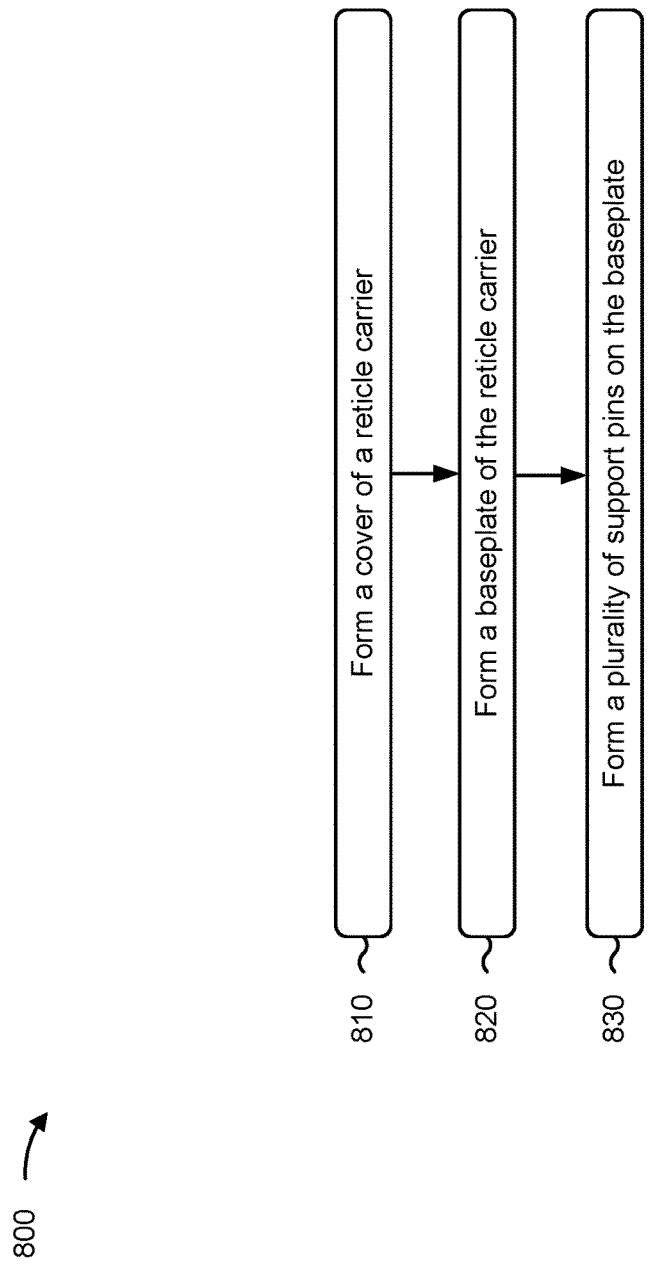
FIG. 8 is a flowchart of an example process relating to forming a reticle carrier described herein.

FIG. 8 is a flowchart of an example process 800 associated with forming a reticle carrier described herein. In some implementations, one or more process blocks of FIG. 8 may be performed by one or more manufacturing devices and/or systems. Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include forming a cover of a reticle carrier (block 810). For example, the inner cover 212 of the reticle carrier 106 may be formed by casting, molding, machining (e.g., computer numerical control (CNC) machining or milling), extruding, three-dimensional (3D) printing or another type of additive manufacturing (e.g., direct metal laser sintering (DMLS)), laser cutting or water jet cutting, forging, injection, thermoforming, welding, and/or another manufacturing technique.

As further shown in FIG. 8, process 800 may include forming a baseplate of the reticle carrier (block 820). For example, the inner baseplate 214 of the reticle carrier 106 may be formed by casting, molding, machining (e.g., CNC machining or milling), extruding, 3D printing or another type of additive manufacturing (e.g., DMLS), laser cutting or water jet cutting, forging, injection, thermoforming, welding, and/or another manufacturing technique. In some implementations, the inner cover 212 and the inner baseplate 214 are configured to be coupled to form an inner space (e.g., an inner space 302 and/or 402) of the reticle carrier 106.

As further shown in FIG. 8, process 800 may include forming a plurality of support pins on the baseplate (block 830). For example, the plurality of support pins (e.g., the support pins 304 and/or 404) on the inner baseplate 214 may be formed by casting, molding, machining (e.g., CNC machining or milling), extruding, 3D printing or another type of additive manufacturing (e.g., DMLS), laser cutting or water jet cutting, forging, injection, thermoforming, welding, and/or another manufacturing technique. In some implementations, at least one of the inner baseplate 214 or the plurality of support pins are formed based on a threshold particle size to prevent particles 314 equal to or greater than the threshold particle size from being electrostatically attracted to the reticle 216 that is to be stored in the reticle carrier 106.

Process 800 may include additional implementations, such as any single implementation or any combination of implementations described below and/or in connection with one or more other processes described elsewhere herein.

In a first implementation, process 800 includes determining (e.g., by the device 600 using the processor 620) the threshold particle size to prevent the particles 314 equal to or greater than the threshold particle size from being electrostatically attracted to the reticle 216. In a second implementation, alone or in combination with the first implementation, forming the inner baseplate 214 includes forming the recessed region 412 in a portion of the inner baseplate 214 based on the threshold particle size to satisfy a capacitance threshold for a capacitance between the inner baseplate 214 and the reticle 216.

In a third implementation, alone or in combination with one or more of the first and second implementations, forming the recessed region 412 includes forming a first portion of the recessed region 412, that is between a first support pin 404a and a second support pin 404b of the plurality of support pins 404, to the first width (w1) in a range of approximately 130 millimeters to approximately 140 millimeters, and forming a second portion of the recessed region 412, that is not in between the first support pin 404a and the second support pin 404b, to the second width (w2) in a range of approximately 140 millimeters to approximately 155 millimeters.

In a fourth implementation, alone or in combination with one or more of the first through third implementations, process 800 includes determining (e.g., by the device 600 using the processor 620) an electrostatic force threshold for attracting particles 314 equal to the threshold particle size to the reticle 216, determining an electric field magnitude, for an estimated electric field between the inner baseplate 214 and the reticle 216, such that the electrostatic force threshold is not satisfied, and determining (e.g., by the device 600 using the processor 620) a distance (d1, d4) between the inner baseplate 214 and the reticle 216 based on the electric field magnitude.

In a fifth implementation, alone or in combination with one or more of the first through fourth implementations, forming the inner baseplate 214 includes forming the inner baseplate 214 to satisfy the distance (d1, d4). In a sixth implementation, alone or in combination with one or more of the first through fifth implementations, forming the plurality of support pins includes forming the plurality of support pins to satisfy the distance (d1, d4). In a seventh implementation, alone or in combination with one or more of the first through sixth implementations, the distance (d1, d4) is in a range of approximately 1150 microns to approximately 4000 microns.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a reticle carrier described herein is configured to quickly discharge the residual charge on a reticle so as to reduce, minimize, and/or prevent particles in the reticle carrier from being attracted to and/or transferred to the reticle. In particular, the reticle carrier may be configured to provide reduced capacitance between an inner baseplate of the reticle carrier and the reticle. The reduction in capacitance may reduce the resistance-capacitance (RC) time constant for discharging the residual charge on the reticle, which may increase the discharge speed for discharging the residual charge through support pins of the reticle carrier. The increase in discharge speed may reduce the likelihood that an electrostatic force in the reticle carrier may attract particles in the reticle carrier to the reticle. This may reduce pattern defects transferred to substrates that are patterned using the reticle, may increase semiconductor device manufacturing quality and yield, and may reduce scrap and rework of semiconductor devices and/or wafers.

As described in greater detail above, some implementations described herein provide a method. The method includes retrieving a reticle from an electrostatic chuck of an exposure tool. The method includes positioning the reticle on a plurality of support pins included on a baseplate of a reticle carrier, where a residual charge on the reticle from the electrostatic chuck is discharged through the plurality of support pins when the reticle is positioned on the plurality of support pins, and where a distance between the reticle and the baseplate is configured to prevent attraction of particles equal to or greater than a threshold particle size from the reticle carrier to the reticle. The method includes positioning a cover of the reticle carrier over the reticle such that the reticle is enclosed in an inner space formed between the cover and the baseplate.

As described in greater detail above, some implementations described herein provide a reticle carrier. The reticle carrier includes a cover. The reticle carrier includes a baseplate, where the cover and the baseplate are configured to be coupled to enclose a reticle in an inner space formed by the cover and the baseplate. The reticle carrier includes a plurality of support pins, on the baseplate, configured to support the reticle in the inner space, where at least one of the baseplate or the plurality of support pins are configured to facilitate discharging of a residual charge on the reticle when the reticle is placed in the reticle carrier.

As described in greater detail above, some implementations described herein provide a method. The method includes forming a cover of a reticle carrier. The method includes forming a baseplate of the reticle carrier, where the cover and the baseplate are configured to be coupled to form an inner space of the reticle carrier. The method includes forming a plurality of support pins on the baseplate, where at least one of the baseplate or the plurality of support pins are formed based on a threshold particle size to prevent particles equal to or greater than the threshold particle size from being electrostatically attracted to a reticle that is to be stored in the reticle carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  positioning a reticle on a plurality of support pins included on a baseplate of a reticle carrier,
    wherein a residual charge on the reticle is discharged through the plurality of support pins when the reticle is positioned on the plurality of support pins,
    wherein a distance between the reticle and the baseplate is configured to prevent attraction of particles equal to or greater than a threshold particle size from the reticle carrier to the reticle, and
    wherein the distance between the reticle and the baseplate is further configured to satisfy at least one of a discharge rate parameter associated with the reticle or a capacitance parameter associated with the reticle and the baseplate; and
  positioning a cover of the reticle carrier over the reticle such that the reticle is enclosed in an inner space formed between the cover and the baseplate.

2. The method of claim 1, wherein the distance between the reticle and the baseplate corresponds to a height of the plurality of support pins.

3. The method of claim 1, wherein the distance between the reticle and the baseplate corresponds to a combination of a height of the plurality of support pins and a depth of a recessed region in the baseplate.

4. The method of claim 1, wherein the distance between the reticle and the baseplate is configured to satisfy the discharge rate parameter associated with the reticle.

5. The method of claim 1, wherein the distance between the reticle and the baseplate is configured to satisfy the capacitance parameter associated with the reticle and the baseplate.

6. A reticle carrier, comprising:
  a baseplate; and
  a plurality of support pins, on the baseplate, configured to support the reticle,
    wherein at least one of the baseplate or the plurality of support pins are configured to facilitate discharging of a residual charge on the reticle when the reticle is placed in the reticle carrier, and wherein a distance between the reticle and the baseplate is further configured to satisfy at least one of a discharge rate parameter associated with the reticle or a capacitance parameter associated with the reticle and the baseplate.

7. The reticle carrier of claim 6, wherein a height the plurality of support pins is in a range of approximately 1150 microns to approximately 4000 microns.

8. The reticle carrier of claim 6, wherein the baseplate includes a recessed region in between the plurality of support pins and within a perimeter defined by the plurality of support pins.

9. The reticle carrier of claim 8, wherein a first distance between the recessed region and a top of a support pin of the plurality of support pins is greater relative to a second distance between a non-recessed portion of the baseplate and the top of the support pin.

10. The reticle carrier of claim 9, wherein at least one of:
the first distance is in a range of approximately 1150 microns to approximately 4000 microns, or
a depth of the recessed region, relative to a top surface of the non-recessed portion, is in a range of approximately 1000 microns to approximately 3500 microns.

11. The reticle carrier of claim 9, wherein a ratio between a depth of the recessed region, relative to a top surface of the non-recessed portion, and a thickness of the baseplate in the recessed region is in a range of approximately 0.13 to approximately 0.7.

12. The reticle carrier of claim 8, wherein at least one of:
a first width of a first portion of the recessed region, that is in between a first support pin and a second support pin of the plurality of support pins, is in a range of approximately 130 millimeters to approximately 140 millimeters; or
a second width of the recessed region, that is not in between the first support pin and the second support pin, is in a range of approximately 140 millimeters to approximately 155 millimeters.

13. A method, comprising:
forming a baseplate of a reticle carrier; and
forming a plurality of support pins on the baseplate,
wherein at least one of the baseplate or the plurality of support pins are formed based on a threshold particle size to prevent particles equal to or greater than the threshold particle size from being electrostatically attracted to a reticle that is to be stored in the reticle carrier, and
wherein the method further comprises at least one of:
determining the threshold particle size to prevent the particles equal to or greater than the threshold particle size from being electrostatically attracted to the reticle, or
determining that a recessed region in a portion of the baseplate satisfies a capacitance threshold for a capacitance between the baseplate and the reticle.

14. The method of claim 13, further comprising:
determining the threshold particle size to prevent the particles equal to or greater than the threshold particle size from being electrostatically attracted to the reticle.

15. The method of claim 13, wherein forming the baseplate comprises:
forming the recessed region in the portion of the baseplate based on the threshold particle size to satisfy the capacitance threshold for the capacitance between the baseplate and the reticle.

16. The method of claim 15, wherein forming the recessed region comprises at least one of:
forming a first portion of the recessed region, that is between a first support pin and a second support pin of the plurality of support pins, to a first width in a range of approximately 130 millimeters to approximately 140 millimeters; or
forming a second portion of the recessed region, that is not in between the first support pin and the second support pin, to a second width in a range of approximately 140 millimeters to approximately 155 millimeters.

17. The method of claim 13, further comprising:
determining an electrostatic force threshold for attracting particles equal to the threshold particle size to the reticle;
determining an electric field magnitude, for an estimated electric field between the baseplate and the reticle, such that the electrostatic force threshold is not satisfied; and
determining a distance between the baseplate and the reticle based on the electric field magnitude.

18. The method of claim 17, wherein forming the baseplate comprises:
forming the baseplate to satisfy the distance.

19. The method of claim 17, wherein forming the plurality of support pins comprises:
forming the plurality of support pins to satisfy the distance.

20. The method of claim 17, wherein the distance is in a range of approximately 1150 microns to approximately 4000 microns.

* * * * *